(12) United States Patent
Chiang

(10) Patent No.: US 6,594,796 B1
(45) Date of Patent: Jul. 15, 2003

(54) SIMULTANEOUS PROCESSING FOR ERROR DETECTION AND P-PARITY AND Q-PARITY ECC ENCODING

(75) Inventor: Kevin Chiang, Fremont, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 351 days.

(21) Appl. No.: 09/608,236

(22) Filed: Jun. 30, 2000

(51) Int. Cl.⁷ .................. G06F 11/00; H03M 13/00
(52) U.S. Cl. .................. 714/800; 714/758; 714/785
(58) Field of Search .................. 714/800, 804, 714/701, 755, 756, 757, 760, 761, 762, 763, 764, 766, 784, 785

(56) References Cited

U.S. PATENT DOCUMENTS

| | | | | |
|---|---|---|---|---|
| 4,604,750 A | * | 8/1986 | Manton et al. | 714/764 |
| 5,408,477 A | * | 4/1995 | Okada et al. | 714/755 |
| 5,457,702 A | * | 10/1995 | Williams et al. | 714/760 |
| 6,041,431 A | * | 3/2000 | Goldstein | 714/784 |
| 6,405,343 B1 | * | 6/2002 | Chiang | 714/804 |

* cited by examiner

*Primary Examiner*—Emmanuel L. Moise
(74) *Attorney, Agent, or Firm*—John F. Schipper

(57) ABSTRACT

Method and system for receiving each data element of an array once and simultaneously forming an EDC error detection term, two ECC P-parity checkbytes and two ECC-Q-parity checkbytes for the array. Each data element is read once from memory and is received by an EDC processor, by an ECC-P processor and by an ECC-Q processor and is processed in parallel and substantially simultaneously by the three processors to form an EDC error detection term and the ECC-P-parity and ECC-Q-parity checkbytes, using shift registers with feed-back and/or weighted summation of selected register contents.

16 Claims, 16 Drawing Sheets

|    | 0    | 1    | 2    | 3    | ... | 40   | 41   | 42   |
|----|------|------|------|------|-----|------|------|------|
| 0  | 0000 | 0001 | 0002 | 0003 | ... | 0040 | 0041 | 0042 |
| 1  | 0043 | 0044 | 0045 | 0046 | ... | 0083 | 0084 | 0085 |
| 2  | 0086 | 0087 | 0088 | 0089 | ... | 0126 | 0127 | 0128 |
| 3  | 0129 | 0130 | 0131 | 0132 | ... | 0169 | 0170 | 0171 |
| ⋮  |      |      |      |      |     |      |      |      |
| 21 | 0903 | 0904 | 0905 | 0906 | ... | 0943 | 0944 | 0945 |
| 22 | 0946 | 0947 | 0949 | 0949 | ... | 0986 | 0987 | 0988 |
| 23 | 0989 | 0990 | 0991 | 0992 | ... | 1029 | 1030 | 1031 |

Fig. 2

|    | 0    | 1    | 2    | 3    | 4    | 5    | 6    | 7    | 8    | 9    | 10   | 11   | 12   | 13   |
|----|------|------|------|------|------|------|------|------|------|------|------|------|------|------|
| 0  | 0    |      |      |      |      |      |      |      |      |      |      |      |      |      |
| 1  | 43   | 44   | 88   | 132  | 176  | 220  | 264  | 308  | 352  | 396  | 440  | 484  | 528  | 572  |
| 2  | 86   | 87   | 131  | 175  | 219  | 263  | 307  | 351  | 395  | 439  | 483  | 527  | 571  | 615  |
| 3  | 129  | 130  | 174  | 218  | 262  | 306  | 350  | 394  | 438  | 482  | 526  | 570  | 614  | 658  |
| 4  | 172  | 173  | 217  | 261  | 305  | 349  | 393  | 437  | 481  | 525  | 569  | 613  | 657  | 701  |
| 5  | 215  | 216  | 260  | 304  | 348  | 392  | 436  | 480  | 524  | 568  | 612  | 656  | 700  | 744  |
| 6  | 258  | 259  | 303  | 347  | 391  | 435  | 479  | 523  | 567  | 611  | 655  | 699  | 743  | 787  |
| 7  | 301  | 302  | 346  | 390  | 434  | 478  | 522  | 566  | 610  | 654  | 698  | 745  | 786  | 830  |
| 8  | 344  | 345  | 389  | 433  | 477  | 521  | 565  | 609  | 653  | 697  | 741  | 785  | 829  | 873  |
| 9  | 387  | 388  | 432  | 476  | 520  | 564  | 608  | 652  | 696  | 740  | 784  | 828  | 872  | 916  |
| 10 | 430  | 431  | 475  | 519  | 563  | 607  | 651  | 695  | 739  | 783  | 827  | 871  | 915  | 959  |
| 11 | 473  | 474  | 518  | 562  | 606  | 650  | 694  | 738  | 782  | 826  | 870  | 914  | 958  | 1002 |
| 12 | 516  | 517  | 561  | 605  | 649  | 693  | 737  | 781  | 825  | 869  | 913  | 957  | 1001 | 1045 |
| 13 | 559  | 560  | 604  | 648  | 692  | 736  | 780  | 824  | 868  | 912  | 956  | 1000 | 1044 | 1088 |
| 14 | 602  | 603  | 647  | 691  | 735  | 779  | 823  | 867  | 911  | 955  | 999  | 1043 | 1087 | 13   |
| 15 | 645  | 646  | 690  | 734  | 778  | 822  | 866  | 910  | 954  | 998  | 1042 | 1086 | 12   | 56   |
| 16 | 688  | 689  | 733  | 777  | 821  | 865  | 909  | 953  | 997  | 1041 | 1085 | 11   | 55   | 99   |
| 17 | 731  | 732  | 776  | 820  | 864  | 908  | 952  | 996  | 1040 | 1084 | 10   | 54   | 98   | 142  |
| 18 | 774  | 775  | 819  | 863  | 907  | 951  | 995  | 1039 | 1083 | 9    | 53   | 97   | 141  | 185  |
| 19 | 817  | 818  | 862  | 906  | 950  | 994  | 1038 | 1082 | 8    | 52   | 96   | 140  | 184  | 228  |
| 20 | 860  | 861  | 905  | 949  | 993  | 1037 | 1081 | 7    | 51   | 95   | 139  | 183  | 227  | 271  |
| 21 | 903  | 904  | 948  | 992  | 1036 | 1080 | 6    | 50   | 94   | 138  | 182  | 226  | 270  | 314  |
| 22 | 946  | 947  | 991  | 1035 | 1079 | 5    | 49   | 93   | 137  | 181  | 225  | 269  | 313  | 357  |
| 23 | 989  | 990  | 1034 | 1078 | 4    | 48   | 92   | 136  | 180  | 224  | 268  | 312  | 356  | 400  |
| 24 | 1032 | 1033 | 1077 | 3    | 47   | 91   | 135  | 179  | 223  | 267  | 311  | 355  | 399  | 443  |
| 25 | 1075 | 1076 | 2    | 46   | 90   | 134  | 178  | 222  | 266  | 310  | 354  | 398  | 442  | 486  |
|    |      | 1    | 45   | 89   | 133  | 177  | 221  | 265  | 309  | 353  | 397  | 441  | 485  | 529  |

Fig. 3A

| 14 | 15 | 16 | 17 | 18 | 19 | 20 | 21 | 22 | 23 | 24 | 25 | 26 | 27 | 28 |
|---|---|---|---|---|---|---|---|---|---|---|---|---|---|---|
| 616 | 660 | 704 | 748 | 792 | 836 | 880 | 924 | 968 | 1012 | 1056 | 1100 | 26 | 70 | 114 |
| 659 | 703 | 747 | 791 | 835 | 879 | 923 | 967 | 1011 | 1055 | 1099 | 25 | 69 | 113 | 157 |
| 702 | 746 | 790 | 834 | 878 | 922 | 966 | 1010 | 1054 | 1098 | 24 | 68 | 112 | 156 | 200 |
| 745 | 789 | 833 | 877 | 921 | 965 | 1009 | 1053 | 1097 | 23 | 67 | 111 | 155 | 199 | 243 |
| 788 | 832 | 876 | 920 | 964 | 1008 | 1052 | 1096 | 22 | 66 | 110 | 154 | 198 | 242 | 286 |
| 831 | 875 | 919 | 963 | 1007 | 1051 | 1095 | 21 | 65 | 109 | 153 | 197 | 241 | 285 | 329 |
| 874 | 918 | 962 | 1006 | 1050 | 1094 | 20 | 64 | 108 | 152 | 196 | 240 | 284 | 328 | 372 |
| 917 | 961 | 1005 | 1049 | 1093 | 19 | 63 | 107 | 151 | 195 | 239 | 283 | 327 | 371 | 415 |
| 960 | 1004 | 1048 | 1092 | 18 | 62 | 106 | 150 | 194 | 238 | 282 | 326 | 370 | 414 | 458 |
| 1003 | 1047 | 1091 | 17 | 61 | 105 | 149 | 193 | 237 | 281 | 325 | 369 | 413 | 457 | 501 |
| 1046 | 1090 | 16 | 60 | 104 | 148 | 192 | 236 | 280 | 324 | 368 | 412 | 456 | 500 | 544 |
| 1089 | 15 | 59 | 103 | 147 | 191 | 235 | 279 | 323 | 367 | 411 | 455 | 542 | 543 | 587 |
| 14 | 58 | 102 | 146 | 190 | 234 | 278 | 322 | 366 | 410 | 454 | 498 | 542 | 586 | 630 |
| 57 | 101 | 145 | 189 | 233 | 277 | 321 | 365 | 409 | 453 | 497 | 541 | 585 | 629 | 673 |
| 100 | 144 | 188 | 232 | 276 | 320 | 364 | 408 | 452 | 496 | 540 | 584 | 628 | 672 | 716 |
| 143 | 187 | 231 | 275 | 319 | 363 | 407 | 451 | 495 | 539 | 583 | 627 | 671 | 715 | 759 |
| 186 | 230 | 274 | 318 | 362 | 406 | 450 | 494 | 538 | 582 | 626 | 670 | 714 | 758 | 802 |
| 229 | 273 | 317 | 361 | 405 | 449 | 493 | 537 | 581 | 625 | 669 | 713 | 757 | 801 | 845 |
| 272 | 316 | 360 | 404 | 448 | 492 | 579 | 580 | 624 | 668 | 712 | 756 | 800 | 844 | 888 |
| 315 | 359 | 403 | 447 | 491 | 535 | 579 | 623 | 667 | 711 | 755 | 799 | 843 | 887 | 931 |
| 358 | 402 | 446 | 490 | 534 | 578 | 622 | 666 | 710 | 754 | 798 | 842 | 886 | 930 | 974 |
| 401 | 445 | 489 | 533 | 577 | 621 | 665 | 709 | 753 | 797 | 841 | 885 | 929 | 973 | 1017 |
| 444 | 488 | 532 | 576 | 620 | 664 | 708 | 752 | 796 | 840 | 884 | 928 | 972 | 1016 | 1060 |
| 487 | 531 | 575 | 619 | 663 | 707 | 751 | 795 | 839 | 883 | 927 | 971 | 1015 | 1059 | 1103 |
| 530 | 574 | 618 | 662 | 706 | 750 | 794 | 838 | 882 | 926 | 970 | 1014 | 1058 | 1102 | 28 |
| 573 | 617 | 661 | 705 | 749 | 793 | 837 | 881 | 925 | 969 | 1013 | 1057 | 1101 | 27 | 71 |

Fig. 3B

| 29 | 30 | 31 | 32 | 33 | 34 | 35 | 36 | 37 | 38 | 39 | 40 | 41 | 42 |
|---|---|---|---|---|---|---|---|---|---|---|---|---|---|
| 158 | 202 | 246 | 290 | 334 | 378 | 422 | 466 | 510 | 554 | 598 | 642 | 686 | 730 |
| 201 | 245 | 289 | 333 | 377 | 421 | 465 | 967 | 553 | 597 | 641 | 685 | 729 | 773 |
| 244 | 288 | 332 | 376 | 420 | 464 | 508 | 552 | 596 | 640 | 684 | 728 | 772 | 816 |
| 287 | 331 | 375 | 419 | 463 | 507 | 551 | 595 | 639 | 683 | 727 | 771 | 815 | 859 |
| 330 | 374 | 418 | 462 | 506 | 550 | 594 | 638 | 682 | 726 | 770 | 814 | 858 | 902 |
| 373 | 417 | 461 | 505 | 549 | 593 | 637 | 681 | 725 | 769 | 813 | 857 | 901 | 945 |
| 416 | 460 | 504 | 548 | 592 | 636 | 680 | 724 | 768 | 812 | 856 | 900 | 944 | 988 |
| 459 | 503 | 547 | 591 | 635 | 679 | 723 | 767 | 811 | 855 | 899 | 943 | 987 | 1031 |
| 502 | 546 | 590 | 634 | 678 | 722 | 766 | 810 | 854 | 898 | 942 | 986 | 1030 | 1074 |
| 545 | 589 | 633 | 677 | 721 | 765 | 809 | 853 | 897 | 941 | 985 | 1029 | 1073 | 1117 |
| 588 | 632 | 676 | 720 | 764 | 808 | 852 | 896 | 940 | 984 | 1028 | 1072 | 1116 | 42 |
| 631 | 675 | 719 | 763 | 807 | 851 | 895 | 939 | 983 | 1027 | 1071 | 1115 | 41 | 85 |
| 674 | 718 | 762 | 806 | 850 | 894 | 938 | 982 | 1026 | 1070 | 1114 | 40 | 84 | 128 |
| 717 | 761 | 805 | 849 | 893 | 937 | 981 | 1025 | 1069 | 1113 | 39 | 83 | 127 | 171 |
| 760 | 804 | 848 | 892 | 936 | 980 | 1024 | 1068 | 1112 | 38 | 82 | 126 | 170 | 214 |
| 803 | 847 | 891 | 935 | 979 | 1023 | 1067 | 1111 | 37 | 81 | 125 | 169 | 213 | 257 |
| 846 | 890 | 934 | 978 | 1022 | 1066 | 1110 | 36 | 80 | 124 | 168 | 212 | 256 | 300 |
| 889 | 933 | 977 | 1021 | 1065 | 1109 | 35 | 79 | 123 | 167 | 211 | 255 | 299 | 343 |
| 932 | 976 | 1020 | 1064 | 1108 | 34 | 78 | 122 | 166 | 210 | 254 | 298 | 342 | 386 |
| 975 | 1019 | 1063 | 1107 | 33 | 77 | 121 | 165 | 209 | 253 | 297 | 341 | 385 | 429 |
| 1018 | 1062 | 1106 | 32 | 76 | 120 | 164 | 208 | 252 | 296 | 340 | 384 | 428 | 472 |
| 1061 | 1105 | 31 | 75 | 119 | 163 | 207 | 251 | 295 | 339 | 383 | 427 | 471 | 515 |
| 1104 | 30 | 74 | 118 | 162 | 206 | 250 | 294 | 338 | 382 | 426 | 470 | 514 | 558 |
| 29 | 73 | 117 | 161 | 205 | 249 | 293 | 337 | 381 | 425 | 469 | 513 | 557 | 601 |
| 72 | 116 | 160 | 204 | 248 | 292 | 336 | 380 | 424 | 468 | 512 | 556 | 600 | 644 |
| 115 | 159 | 203 | 247 | 291 | 335 | 379 | 423 | 467 | 511 | 555 | 599 | 643 | 687 |

Fig. 3C

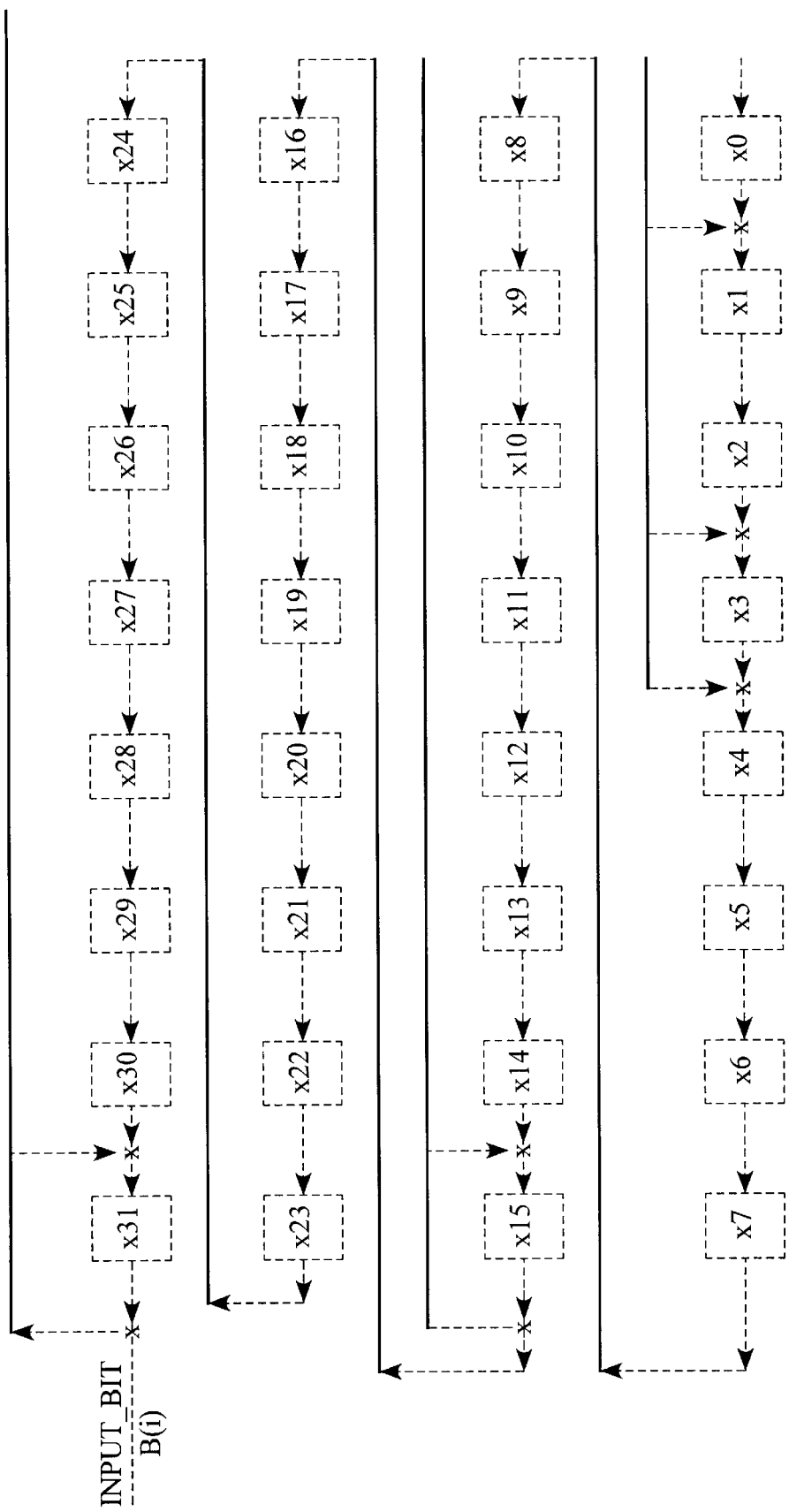

SIMULTANEOUS PROCESSING FOR ERROR DETECTION AND P-PARITY AND Q-PARITY ECC ENCODING

FIELD OF THE INVENTION

This invention relates to processing of data information in error control encoding.

BACKGROUND OF THE INVENTION

In parity-based error control procedures that are presently used, data representing a "bare" message, without error control bytes attached thereto, are read from memory three times: once to calculate an error detection control (EDC) segment, once to calculate a P-parity checkbyte, and once to calculate a Q-parity checkbyte for error correction control (ECC). Each read operation requires a certain time increment, and this triple reading of each data byte adds substantially to the total time required to generate error detection bytes and error correction bytes on a given data block.

What is needed is an approach that reduces to one the number of times a given array of data elements must be read from memory, without substantially increasing the time required for subsequent processing of the data for ECC encoding purposes. Preferably, the approach should be flexible enough to allow each data element received to be used for more than one computation and should not require that the error control procedures be performed in a particular order. Preferably, the approach should extend to data element arrays of arbitrary size.

SUMMARY OF THE INVENTION

These needs are met by the invention, which provides a modified procedure for using an array of data elements, each read once from memory, received separately at an EDC processor, at an ECC P-parity processor and at an ECC Q-parity processor, and processed in parallel in the three processors to compute an EDC error detection term and, simultaneously, to compute two ECC P-parity syndromes s0 and s1 and two ECC Q-parity syndromes. A first algorithm is used at the EDC processor to compute the EDC term by receiving the sequence $\{s(k)\}$ of data elements (k=0, 1, . . . , M·N−1, with M=24 and N=43 in an example) in serial order and computing the EDC terms as the data elements are received. A second algorithm is used in parallel at the ECC-P processor to compute components of two ECC P-parity syndromes (and, optionally, two corresponding ECC P-parity checkbytes) as the data elements are received in serial order. A third algorithm is used in parallel at the ECC-Q processor to compute components of two ECC Q-parity syndromes (and, optionally, two ECC Q-parity checkbytes) as the data elements are received in serial order. Because the three processors operate independently but in parallel, the time required for combined EDC, ECC-P and ECC-Q processing is about one-third of what would otherwise be required, and each data element value s(k) need only be read once from memory.

BRIEF DESCRIPTION OF THE DRAWINGS

FIGS. 2, 3A, 3B and 3C illustrate a 26×43 array of data elements, in a standard arrangement and rearranged so that the P-parity syndrome components and Q-parity syndrome components form columns and rows.

FIG. 4 illustrates a shift register configuration suitable for determining one or more EDC error detection checkbytes.

DESCRIPTION OF BEST MODES OF THE INVENTION

Figure 1:
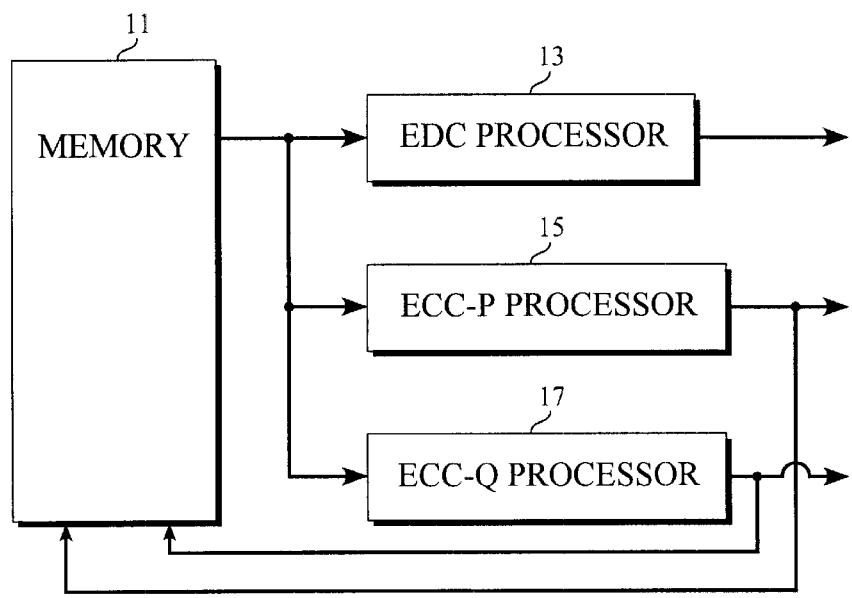
FIG. 1 is a schematic view illustrating use of a data block for EDC, ECC-P and ECC-Q purposes.

FIG. 1 schematically illustrates processing of a data block, read once from memory, for EDC purposes, for ECC-P-parity purposes and for ECC-Q purposes. Data (16-bit in this instance) are read from a memory unit 11 and are received and processed by an EDC processor unit 13. The data read from memory are also received by ECC-P-parity and Q-parity processor units 15 and 17, which compute components for two ECC-P-parity syndromes and two ECC-Q-parity syndromes for the data stream. Computation of the ECC-Q syndromes requires use of the ECC-P syndrome component values so that the ECC-P syndromes are conventionally computed first and placed in a local register for subsequent use for ECC-Q purposes.

The P-parity test for ECC augments each column of the 24×43 array, with two double bytes, representing P-parity syndrome components, s0 and s1, so that each augmented column for P-parity is now 26×1, as illustrated in FIG. 2. Each of the two new rows, designated as s0 and s1, is a 16-bit, 1×43 array. The column entries for the two new rows are computed using linear processes involving only the data entries S(x) in the corresponding column. Thus, once all elements in a particular column, such as column 2, containing the data elements s(0002), s(0045), s(0088), . . . , s(0991), are read in, the syndrome components contributed by that column can be computed. The ECC P-parity check involves powers $\alpha^n$ (n=0, 1, . . . , 7) of an eight-bit primitive $\alpha$ that satisfies a selected primitive polynomial relation $$p(\alpha)=0. \tag{1}$$

For example, the primitive polynomial equation may be selected to be $$p(\alpha)=\alpha^8+\alpha^4+\alpha^3+\alpha^2+1=0, \tag{2}$$

and the "0" element, the "1" element and several powers of $\alpha$ become $0=\{0,0,0,0,0,0,0,0\},$ $\alpha^0=\{0,0,0,0,0,0,0,1\}=\alpha^{255}$ (="1"), $\alpha=\{0,0,0,0,0,0,1,0\},$ $\alpha^2=\{0,0,0,0,0,1,0,0\},$ $\alpha^3=\{0,0,0,0,1,0,0,0\},$ $\alpha^4=\{0,0,0,1,0,0,0,0\},$ $\alpha^5 = \{0,0,1,0,0,0,0,0\}$,
$\alpha^6 = \{0,1,0,0,0,0,0,0\}$,
$\alpha^7 = \{1,0,0,0,0,0,0,0\}$, $$\alpha^8 = \{0,0,0,1,1,1,0,1\} = \alpha^4 + \alpha^3 + \alpha^2 + 1, \tag{3}$$

$$\alpha^9 = \{0,0,1,1,1,0,1,0\} = \alpha \cdot \alpha^8 = \alpha^5 + \alpha^4 + \alpha^3 + \alpha, \tag{3}$$

$\alpha^{230} = \{1,1,1,1,0,1,0,0\}$,
$\alpha^{231} = \{1,1,1,1,0,1,0,1\}$,
$\alpha^{232} = \{1,1,1,1,0,1,1,1\}$, where the particular powers $\alpha^n$ (n=230, 231, 232) will be needed in the following development. The remaining powers $\alpha^n$ ($10 \leq n \leq 255$) are generated using the particular primitive polynomial equation (2). Change of the choice of primitive polynomial will cause a corresponding change in definition of most of the powers of $\alpha$.

The particular P-parity checkbytes c0 and c1 are formed as follows, using an array such as the one shown in FIG. 2. Two syndrome components s0 and s1 for P-parity are defined by $$s0[n1] = \sum_{n2=0}^{M-1} 1 \cdot s(n1 + N \cdot n2) \ (n1 = 0, 1, \ldots, N-1), \tag{4}$$

$$s1[n1] = \sum_{n2=0}^{M-1} \alpha^{M-1-n2} \cdot s(n1 + N \cdot n2), \tag{5}$$

where, for example, the choices N=43 and M=24 correspond to the array for P-parity error correction shown in FIG. 2. Two checkbytes, c0 and c1, are added for every code word to detect up to two errors per code word and to allow correction of up to one error per code word. The components of the two P-parity checkbytes are computed as follows.

$$c0[n1] = \alpha^{230} \cdot s0[n1] + \alpha^{232} \cdot s1[n1] \ (n1=0, 1, \ldots, N-1) \tag{6}$$

$$c1[n1] = \alpha^{231} \cdot s0[n1] + \alpha^{232} \cdot s1[n1]. \tag{7}$$

With reference to FIGS. 2 or 3, the syndromes s0' and s1' for Q-parity have the components $$s0'[n2] = \sum_{n1=0}^{N-1} 1 \cdot s((N+1) \cdot n1 + N \cdot n2)_{R2} \ (n2 = 0, 1, \ldots, M+1) \tag{8}$$

$$s1'[n2] = \sum_{n1=0}^{N-1} \alpha^{N-1-n1} \cdot s((N+1) \cdot n1 + N \cdot n2)_{R2}, \tag{9}$$

where the subscript "R2" on the data elements $s((N+1) \cdot n1 + N \cdot n2)$ indicates that the argument, $(N+1) \cdot n1 + N \cdot n2$, is to be computed modulo R2, with $$R2 = N \cdot M2 = N \cdot (M+2). \tag{10}$$

For the P-array shown in FIG. 2, N=43, M+2=26 and $(M+2) \cdot N = 1118$. As indicated in FIG. 2, computation of the Q-parity syndromes requires use of the augmented data elements lying along a diagonal, rather than in a column.

In the argument $1 \cdot n1 + N \cdot n2$, the integers 1 and N are relatively prime to each other and have no common integer divisors except 1. The integer equation $n1 + N \cdot n2 = 0 \pmod{R}$, with $R = M \cdot N$, has no non-integer solution pair (n1,n2) in the ranges $0 \leq n1 \leq N-1$ and $0 \leq n2 \leq M-1$. The integer equation $$1 \cdot n1 + N \cdot n2 = h1 \pmod{R} \ (0 \leq h1 \leq R) \tag{11}$$

has a solution pair (n1(h1),n2(h1)) in the range $0 \leq n1 \leq N-1$ and $0 \leq n2 \leq M-1$.

In the argument $(N+1) \cdot n1 + N \cdot n2$, the two integers N and N+1 are relatively prime to each other and have no common integer divisors except 1. Thus, the integer equation $(N+1) \cdot n1 + N \cdot n2 = 0 \pmod{R2}$ has no non-zero solution pair (n1,n2) in the ranges $0 \leq n1 \leq N-1$ and $0 \leq n2 \leq M+1$. The integer equation $$(N+1) \cdot n1 + N \cdot n2 = h2 \pmod{R2} \ (0 \leq h2 \leq R2-1) \tag{12}$$

has a unique solution pair (n1(h2),n2(h2)) in the range $0 \leq n1 \leq N-1$ and $0 \leq n2 < M+1$. These results will be useful in constructing the P-parity and Q-parity components according to one embodiment of the invention.

As each checkbyte component, c0[n1] and c1[n1], is computed in the ECC-P processor 15, using Eqs. (4) and (5), this checkbyte component is added to row 25 (for c0) or to row 26 (for c1) for the corresponding column in FIG. 2. The two rows number 25 and 26 now have the respective row supplemental entries s(1032+n1)=c0[n1] and s(1075+n1)=c1[n1] (n1=0, 1, . . . , 42).

The Q-parity syndrome components are computed using diagonal sums of the data entries, as indicated in FIG. 2, in which the syndrome components s(1032+m1) and s(1075+m1) (m1=0, 1, . . . , 42) are now included as part of an augmented P-array. If the P-array shown in FIG. 2 is rearranged to the format of the 43×26 Q-array shown in FIGS. 3A, 3B, and 3C: (1) the P-parity syndrome components s0[n1] and s1[n1] are formed as weighted sums of the column entries s(k)=s(n1+43·n2) (n2=0, 1, . . . , M-1), with s(k)=0 (k=1032, . . . , 1117) initially; and (2) the Q-parity syndrome components s0'[n2] and s1'[n2] are formed as weighted sums of the row entries s(k)=s(44·n1+43·n2)$_{R2}$ in FIGS. 3A, 3B, and 3C. The Q-array will be used for illustrative purposes in discussions to follow.

An EDC encoder computes and provides an error detection factor that is appended to a digital data stream to allow up to a selected number of errors to be identified in the data stream, as received, using a selected EDC polynomial G(x) for the coding. One suitable choice for the divisor polynomial G(x) is $$G(x) = x^{31} + x^{16} + x^{15} + x^4 + x^3 + x + 1, \tag{13}$$

and this choice is used here for illustrative purposes.

FIG. 4 displays a linear feedback shift register (LFSR), suitably arranged to provide the divisor polynomial G(x). Let $Q_n(i)$ represent the binary value contained in the flipflop number n in FIG. 3 (n=0, 1, . . . , 31) at a cycle time i (i=0, 1, 2, . . . ), and let B(i) be the ith binary value in a sequence of such values that are part of the digital data stream (arriving from the left). Each flip flop n contains a selected initial binary value at cycle time i=0. Three relations define the values contained in each flipflop at any later cycle time ($i \geq 1$):

$$Q_0(i) = B(i-1) \oplus Q_{31}(i-1), \tag{14}$$

$$Q_m(i) = B(i-1) \oplus Q_{31}(i-1) \oplus Q_{m-1}(i-1) \ (m=1,3,4,15,16,31), \tag{15}$$

$$Q_n(i) = Q_{n-1}(i-1) \ (n \neq 1,3,4,15,16,31). \tag{16}$$

An EDC error detection factor, which is appended to the data stream, is the ordered sequence of bit values remaining in the LFSR shown in FIG. 4 after the entire data stream has passed through the LFSR. This sequence may be characterized as a remainder of the data stream of values S(x) modulo a selected divisor polynomial G(x).

The data stream S(x) of values will consist of 1032 two-byte codewords, which may be arranged as a 24×43 array of bytes, as illustrated in FIG. 2. Four bytes, representing an EDC factor for error detection, are appended to and depend upon the values of the data stream.

The EDC error detection factor discussed in the preceding is computed bit-by-bit. The EDC factor can also be computed one byte or, preferably, one word (two bytes) at a time, with appropriate changes in the normal (bit-by-bit) procedure. Where the EDC factor is computed one word at a time, the EDC error detection bits d[k], numbered k=0, 1, 2, ..., 31 from LSB to MSB, are defined as follows.

d[0]=q[31]⊕q[30]⊕q[29]⊕q[28]⊕q[27]⊕q[26]⊕q[25]
⊕q[24]⊕q[23]⊕q[22]⊕q[21]⊕q[20]⊕q[19]⊕q[18]
⊕q[17]⊕q[16]⊕B[15]⊕B[14]⊕B[13]⊕B[12]⊕B[11]
⊕B[10]⊕B[9]⊕B[8]⊕B[7]⊕B[6]⊕B[5]⊕B[4]⊕B[3]
⊕B[2]⊕B[1]⊕B[0], d[1]=q[16]⊕B[15], d[2]=q[17]⊕B[14], d[3]=q[31]⊕q[30]⊕q[29]⊕q[28]⊕q[27]⊕q[26]⊕q[25]
⊕q[24]⊕q[23]⊕q[22]⊕q[21]⊕q[20]⊕q[19]⊕q[17]
⊕q[16]⊕B[15]⊕B[14]⊕B[12]⊕B[11]⊕B[10]⊕B[9]
⊕[8]⊕B[7]⊕B[6]⊕B[5]⊕B[4]⊕B[3]⊕B[2]⊕B[1]
⊕B[0], d[4]=q[19]⊕q[16]⊕B[15]⊕B[12], d[5]=q[20]⊕q[17]⊕B[14]⊕B[11], d[6]=q[21]⊕q[18]⊕B[13]⊕B[10], d[7]=q[22]⊕q[19]⊕B[12]⊕B[9], d[8]=q[23]⊕q[20]⊕B[11]⊕B[8], d[9]=q[24]⊕q[21]⊕B[10]⊕B[7], d[10]=q[25]⊕q[22]⊕B[9]⊕B[6], d[11]=q[26]⊕q[23]⊕B[8]⊕B[5], d[12]=q[27]⊕q[24]⊕B[7]⊕B[4], d[13]=q[28]⊕q[25]⊕B[6]⊕B[3], d[14]=q[29]⊕q[26]⊕B[5]⊕B[2], d[15]=q[31]⊕q[29]⊕q[28]⊕q[26]⊕q[25]⊕q[24]⊕q[23]
⊕q[22]⊕q[21]⊕q[20]⊕q[19]⊕q[18]⊕q[17]⊕q[16]
⊕B[15]⊕B[14]⊕B[13]⊕B[12]⊕B[11]⊕B[10]⊕B[9]
⊕B[8]⊕B[7]⊕B[6]⊕B[5]⊕B[3]⊕B[2]⊕B[0], d[16]=q[31]⊕q[28]⊕q[16]⊕q[0]⊕B[15]⊕B[3]⊕B[0], d[17]=q[29]⊕q[17]⊕q[1]⊕B[14]⊕B[2], d[18]=q[30]⊕q[18]⊕q[2]⊕B[13]⊕B[1], d[19]=q[31]⊕q[19]⊕q[3]⊕B[12]⊕B[0], d[20]=q[20]⊕q[4]⊕B[11], d[21]=q[21]⊕q[5]⊕B[10], d[22]=q[22]⊕q[6]⊕B[9], d[23]=q[23]⊕q[7]⊕B[8], d[24]=q[24]⊕q[8]⊕B[7], d[25]=q[25]⊕q[9]⊕B[6], d[26]=q[26]⊕q[10]⊕B[5], d[27]=q[27]⊕q[11]⊕B[4], d[28]=q[28]⊕q[12]⊕B[3], d[29]=q[29]⊕q[13]⊕B[2], d[30]=q[30]⊕q[14]⊕B[1], d[31]=q[30]⊕q[29]⊕q[28]⊕q[27]⊕q[26]⊕q[25]⊕q[24]
⊕q[23]⊕q[22]⊕q[21]⊕q[20]⊕q[19]⊕q[18]⊕q[17]
⊕q[16]⊕q[15]⊕B[15]⊕B[14]⊕B[13]⊕B[12]⊕B[11]
⊕B[10]⊕B[9]⊕B[8]⊕B[7]⊕B[6]⊕B[5]⊕B[4]
⊕B[3]⊕B[2]⊕B[1].

Four EDC bytes, edc[m] (m=0, 1, 2, 3) can be generated as indicated in FIG. 4, where edc[m] has the following eight-bit sequence:

$$edc[m]=\{d[8·m+0],d[8·m+1],d[8·m+2],d[8·m+3],d[8·m+4],d[8·m+5],\\ d[8·m+6],d[8·m+7]\}. \quad (17)$$

The ordered sequence of 32-bit values remaining in the LFSR, after the data bits B[k] are all passed through the apparatus and through an EDC bit order inverter, is the 32-bit EDC factor, where 16 consecutive bits (a word) are processed consecutively for EDC purposes.

Aram Perez, in "Byte-wise CRC Calculations", I.E.E.E. Micro, June 1983, pp. 40–46, presents analysis of a 16-bit linear feedback shift register and an associated 16th degree CRC polynomial, $G(x)=x^{16}+x^{15}+x^2+1$, that can be used to provide byte-wise, rather than bit-wise, CRC calculations. For a 16-bit LFSR array, configured according to the CRC polynomial above, the upper eight component registers ($R_9$–$R_{16}$) have contents such as $x1 \oplus x2 \oplus x3 \oplus x4 \oplus x5 \oplus x6 \oplus x7 \oplus x8$, $x1 \oplus x2 \oplus x3 \oplus x4 \oplus x5 \oplus x6 \oplus x7$, and $xm \oplus x(m+1)$ (m=2, 3, 4, 5, 6), where $xk=C_k \oplus M_k$ is the Exclusive-Or combination of an initial register bit value $C_k$ and an input bit value $M_k$. The lower eight component registers ($R_{1-R8}$) contain terms such as $x1 \oplus x2 \oplus C_{16}$, $x1 \oplus C_{15}$, $C_m$ (m=10, 11, 12, 13, 14) and $x1 \oplus x2 \oplus x3 \oplus x4 \oplus x5 \oplus x6 \oplus x7 \oplus x8$. Using the developed formalism, the author infers that a CRC calculation can be performed on eight bits (one byte) at a time by pre-loading appropriate values into the registers and into the data input queue ($M_k$).

Byte-wise, rather than bit-wise, CRC calculations may be implemented in the registers $R_9$–$R_{16}$ registers in the following manner. The bit combinations for the upper eight component registers are prepared in parallel and are positioned at the input terminals of the registers $R_9$ through $R_{16}$. In the next time cycle for processing one bit, these input values are loaded into the registers $R_9$ through $R_{16}$. This achieves the equivalent of a byte-wise CRC calculation in a time corresponding to processing of one bit. This technique can be extended to word-wise CRC calculations, handling 16 bits or one word at a time, by making use of a 32nd degree CRC polynomial, such as the polynomial $G1(x) \oplus G2(x)$, where G1(x) and G2(x) are 16th degree divisor polynomials. Use of byte-wise or word-wise CRC calculations rather than the standard bit-wise CRC calculations provides extra time savings.

The procedure discussed herein has been extended to M×N arrays of data elements {s(n1+N·n2)|0≤n1≤N−1; 0≤n2≤M−1} from the particular choices M=24 and N=43. This invention allows the system to read in each element in the data array once, receive the data element at the EDC processor and at the ECC processor, and process the data element in parallel to compute the EDC error detection term and components of the ECC checkbytes c0 and c1.

The particular 32nd degree divisor polynomial used in the EDC processor and set forth in the relation (12) can be replaced by any other suitable 32-bit divisor polynomial. In particular, the 16th degree CRC-16 polynomial in the primitive relation (1) can be replaced by another suitable polynomial, such as $G3(x)=x^{16}+x^{12}+x^5+1$, $G4(x)=x^{16}+x^{12}+x^2+1$, $G5(x)=x^{16}+x^{14}+x+1$, $G6(x)=x^{16}+x^{11}+x^4+1$, or $G7(x)=x^{16}+1$. The 32nd degree divisor can also be used to implement apparatus that performs word-wise (or, if preferred, byte-wise) CRC calculations for the EDC factor used for error detection.

The system shown in FIG. 1 may be characterized as a first sequence of operations carried out on the contents of a first computer register, a second sequence of operations carried out on the contents of a second computer register, and a third sequence of operations carried out on the contents of a third computer register, where the first register is optionally part of an EDC processor and the second and third registers each hold an eight-bit array and are optionally part of an ECC processor. In this characterization, three registers (each 16-bit), and three memory arrays of size max(M,N) are needed to implement the invention, and each data element is read in only once for processing for EDC purposes and for ECC-P-parity purposes.

Because of constraints in processing the data elements s(n1,n2)=s(n1+N·n2), the data elements are preferably read in consecutively once in the format s(00), s(01), s(02), ... s(R−1) and processed immediately. FIGS. 5, 6, 7 and 8 illustrate suitable apparatus for processing the data elements s(k) (k=0000, 0001, ..., R−1) to determine the ECC P-parity, P-parity and Q-parity checkbytes, respectively, according to a first embodiment.

Figure 5:
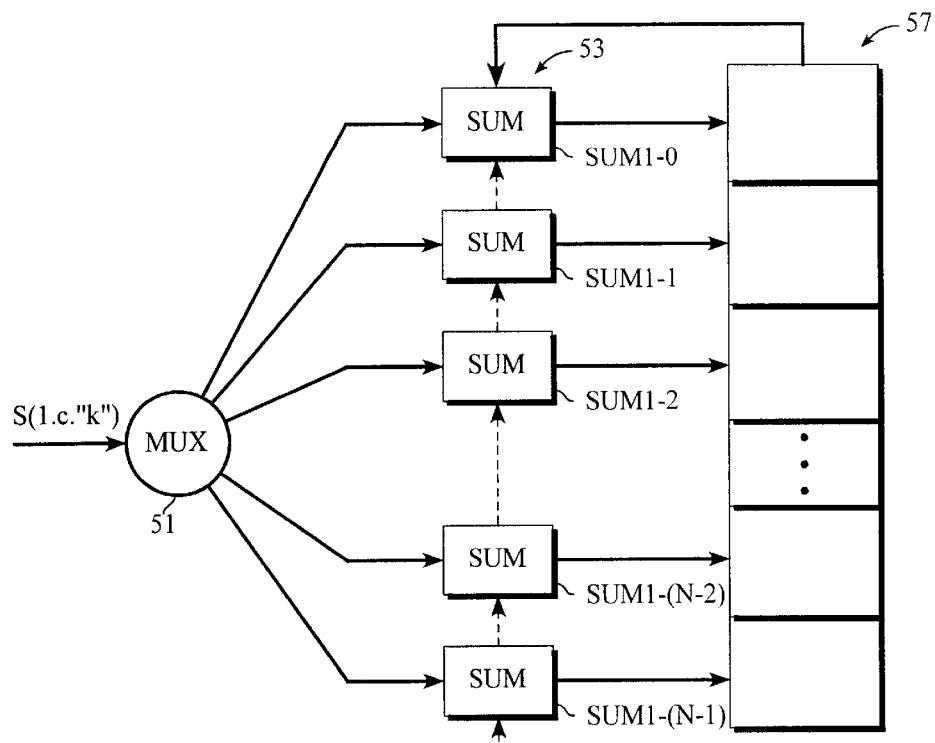
FIGS. 5, 6A, 6B, 7 and 8, and FIGS. 9, 10, 11 and 12, illustrate apparatus suitable for processing a single data stream to compute ECC P-parity and Q-parity syndromes, for a first embodiment and for a second embodiment, respectively.

FIG. 5 illustrates apparatus suitable for calculating the P-parity coefficients s0[n1] according to the first embodiment. A stream of data element values s(k) (k=0, 1, ..., R−1) is received (normally in serial order) at a multiplexer 51. The MUX 51 selectively feeds each presently received data element value s(k) to one of the sum modules SUM1-p (p=0, 1, ..., N−1) with p=k(mod N). Each sum module SUM1-p forms a sum of the received data element value s(k) and the contents of that sum module before the data element value was received. Each sum module SUM1-p is initialized by an initializer 53 to have content "0" before the computations begin. The MUX 51 receives the data element value s(k), is provided with the index "k" for this value, and feeds the data element value s(k) to the sum module SUM1-p (p=0, 1, ..., N−1), which forms a sum of this received value with the content of this sum module and replaces the content by this new sum.

When the MUX 51 senses that R=M·N data element values s(k) have been received and that each has been fed to, and summed with the contents of, one of the sum modules SUM1-p, the MUX 51 causes a readout signal to be sent to each of the sum modules SUM1-p. Receipt of this readout signal causes each sum module SUM1-p to deposit its present content into a register or buffer unit BU1-p (p=0, 1, ..., N−1) in a first register 57. The content of the buffer unit BU1-p represents the P-parity coefficient s0[n1=p].

Figure 6A:
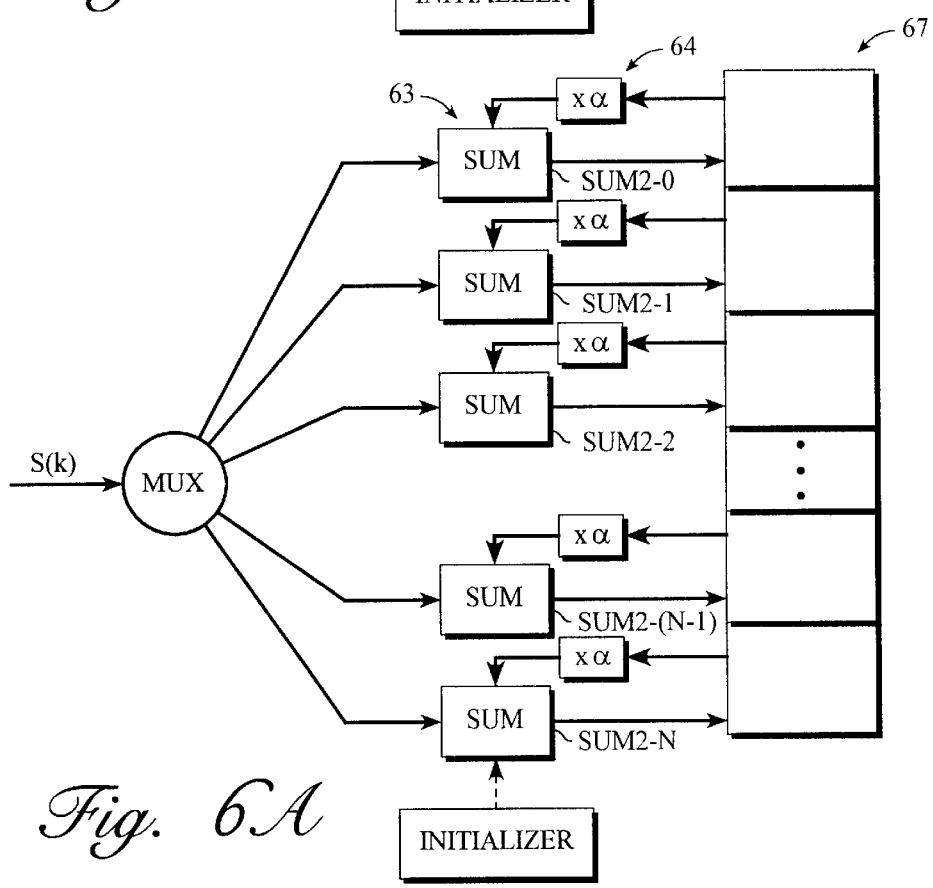

FIG. 6A illustrates apparatus suitable for calculating the P-parity coefficients s1[n1] according to the first embodiment. A stream of data element values s(k) (k=0, 1, ..., R−1) is received (normally in serial order) at a multiplexer 61. The MUX 61 selectively feeds the data value s(k) and the index value k to one of the sum modules, SUM2-p or 63, with p=k(mod N−1). Each sum module SUM2-p forms a sum of the received value s(k) plus α times the contents S1 of that sum module before the data element value s(k) was received, using a bank of α-multiplier modules 64; the sum is now s(k)+α·S1. Each sum module SUM2-p is initialized by an initializer 65 to have content "0" before the computations begin.

When the MUX 61 senses that R=M·N data element values s(k) have been received and that each data value s(k) has been fed to, and summed with the contents of, one of the α-weighted sum modules SUM2-p, the MUX 61 causes a readout signal to be sent to each of the sum modules SUM2-p. Receipt of this readout signal causes each sum module SUM2-p to deposit its present content into a register or buffer unit BU2-p (p=0, 1, ..., N−1) in a second buffer 67. The content of the register unit BU2-p represents the P-parity coefficient s1[n1=p].

Figure 6B:
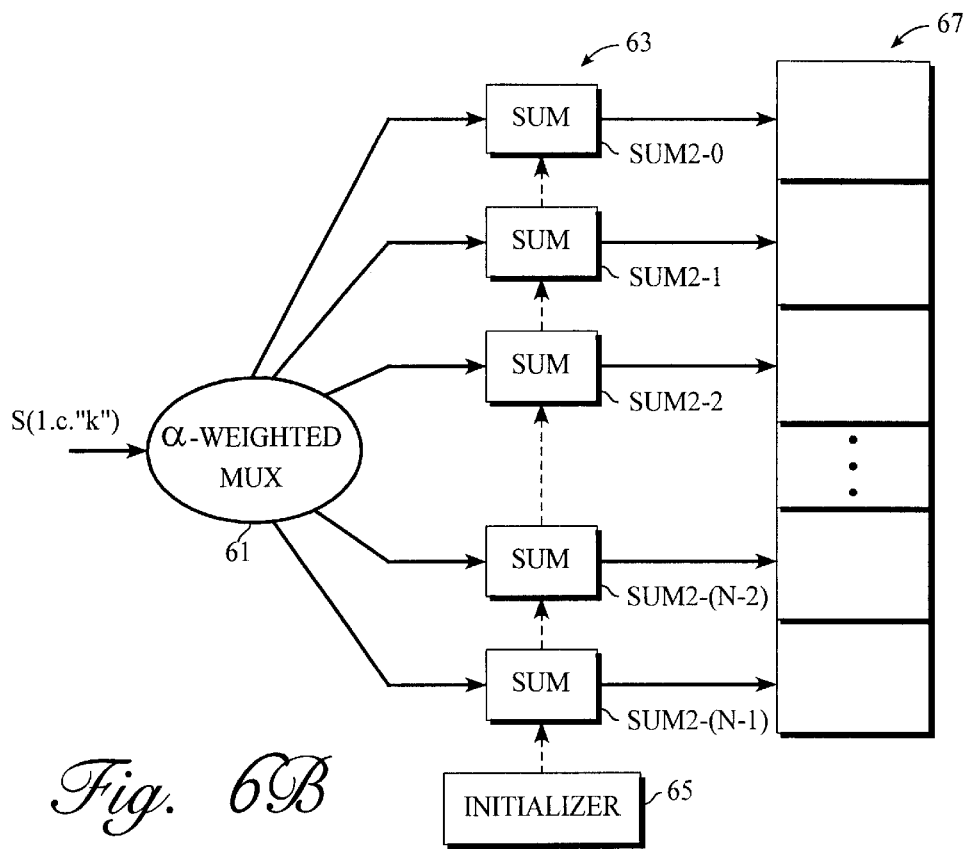

FIG. 6B illustrates alternative apparatus suitable for calculating the P-parity coefficients s1[n1] according to the first embodiment. A stream of data element values s(k) (k=0, 1, ..., R−1) is received (normally in serial order) at an α-weighted multiplexer 61'. The α-MUX 61' multiplies each data element value by an α-power, namely $\alpha^{(M-1-[k/N]int)}$, and selectively feeds the resulting product $\alpha^{(M-1-[k/N]int)} \cdot s(k)$ to one of the sum modules, SUM2-p or 63', with p=k(mod N−1). Here, [w] is the "floor function" or integer part of the real number w. Each sum module SUM2-p forms a sum of the received product $\alpha^{(M-1-[k/N]int)} \cdot s(k)$ and the contents of that sum module before the data element value was received. Each sum module SUM2-p is initialized by an initializer 65' to have content "0" before the computations begin. The α-MUX 61' receives the data element value s(k), is provided with the index "k" for this value, and feeds the product $\alpha^{(M-1-[k/N]int)} \cdot s(k)$ to the sum module SUM2-p (p=k(mod N−1)=0, 1, ..., N−1), which forms a sum of this received value with the content of this sum module and replaces the content by this new sum.

When the α-MUX 61' senses that R=M·N data element values s(k) have been received and that each product $\alpha^{(M-1-[k/N]int)} \cdot s(k)$ has been fed to, and summed with the contents of, one of the sum modules SUM2-p, the α-MUX 61' causes a readout signal to be sent to each of the sum modules SUM2-p. Receipt of this readout signal causes each sum module SUM2-p to deposit its present content into a register or buffer unit BU2-p (p=0, 1, ..., N−1) in a second buffer 67'. The content of the register unit BU2-p represents the P-parity coefficient s1[n1=p].

Figure 7:
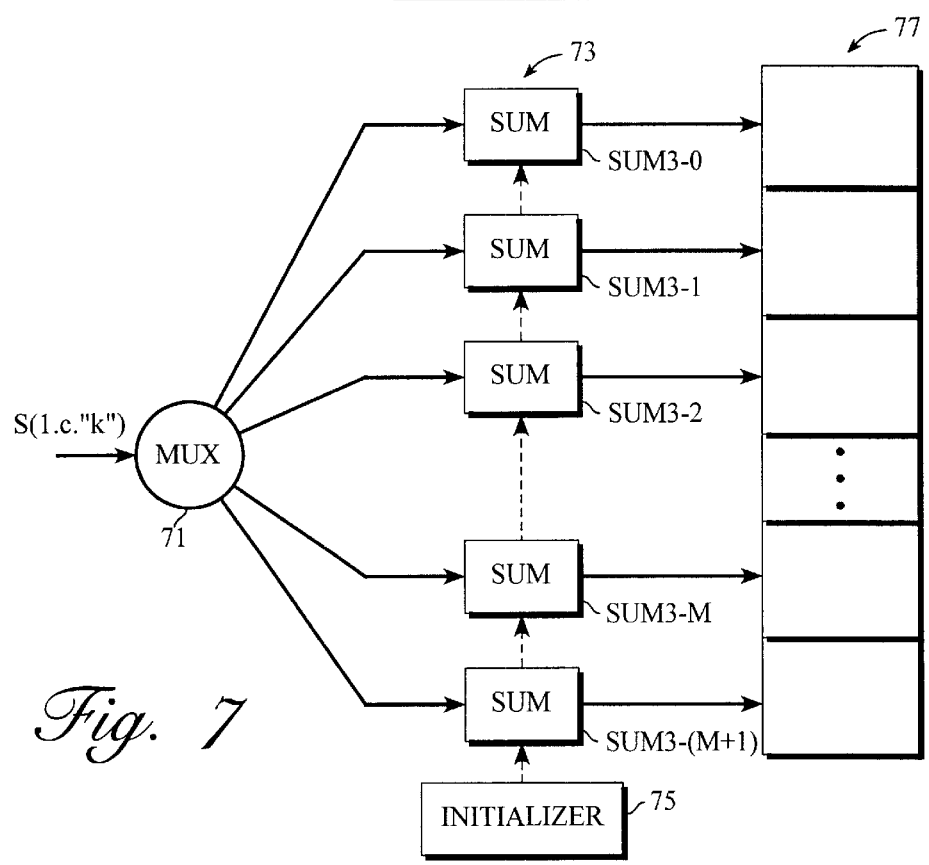

FIG. 7 illustrates apparatus suitable for calculating the Q-parity coefficients s0'[n2] according to the first embodiment. A stream of data element values s(k) (k=0, 1, ..., R−1), augmented by the values s(k) (k=R, ..., R2−1) computed in the P-parity calculations, is received (normally in serial order) at a multiplexer 71. The MUX 71 selectively feeds each presently received data element value s(k) to one of the sum modules SUM3-q (q=0, 1, ..., M+1). Each sum module SUM3-q forms a sum of the received data element value s(k) and the contents of that sum module before the data element value was received. Each sum module SUM3-q is initialized by an initializer 73 to have content "0" before the computations begin. The MUX 71 receives the data element value s(k), is provided with the index "k" for this value, computes the row index q and column index p, and feeds the data element value s(k) to the correct sum module SUM3-q, which forms a sum of this received value with the content of this sum module and replaces the content by this new sum.

If the row index (q=0, 1, 2, ..., 24, 25) and the column index (p=0, 1, 2, ..., 42) are designated as $$(\text{row, column}) = (q, p), \quad (18)$$

one can verify that the assembly of numbers in FIG. 3 are reproduced by the following prescription $$p = k \pmod{43} \ (=0, 1, \ldots, 42) \quad (19A)$$

$$m = \{k/43\}_{int}, \quad (20A)$$

$$q = (m \cdot 44 - k) \pmod{26} \ (=0, 1, \ldots, 25). \quad (21A)$$

For a more generally prescribed M2×N block (M2×N= 26×43 in FIGS. 3A, 3B, and 3C), the analogous prescription becomes $$p = k \pmod{N}, \quad (19\text{B})$$

$$m = [k/N]_{int}, \quad (20\text{B})$$

$$q = (m \cdot N1 - k) \pmod{M2}. \quad (21\text{B})$$

A second prescription for the (row,column) indices (q,p) uses a number theoretic result: for M and N relatively prime integers, each integer k in the range 0, 1, ..., M2·N−1 is uniquely expressible as a modulo sum $$k = ((N+1) \cdot p + N \cdot q) \pmod{\cdot M2 \cdot N)} \quad (22)$$

where p and q are non-negative integers satisfying the constraints $0 \leq p \leq N-1$ and $0 \leq q \leq M+1$. The (row,column) indices (q(k),p(k)) thus become the solutions of Eq. (22).

A third prescription for the (row,column) indices (q,p) uses a pair of functions, one complicated:

$$p = k \pmod{N}, \quad (23)$$

$$q = f(k), \quad (24)$$

$$m = [k/N]_{int},$$

$$f(k) = N1 \cdot m - k \quad (25)$$

$$(N \cdot m \leq k \leq N1 \cdot m; \quad m = 0, 1, 2, \ldots, M+1)$$

$$= (N1 \cdot m - k)_{\text{mod} M2}$$

$$(N1 \cdot m + 1 \leq k \leq N1 \cdot m + M2; \quad m = 0, 1, \ldots, M+1)$$

$$= (N1 \cdot m - k)_{\text{mod} M2}$$

$$(N1 \cdot m + M2 + 1 \leq k \leq N1 \cdot m + N - 1 - m;$$

$$m = 0, 1, \ldots, N - M - 4)$$

$$= (N1 \cdot m - k)_{\text{mod} M2}$$

$$(m \cdot N1 + 1 \leq k \leq N \cdot m + N - 1;$$

$$m = N - M - 3, \ldots, M + 1).$$

Figure 8:
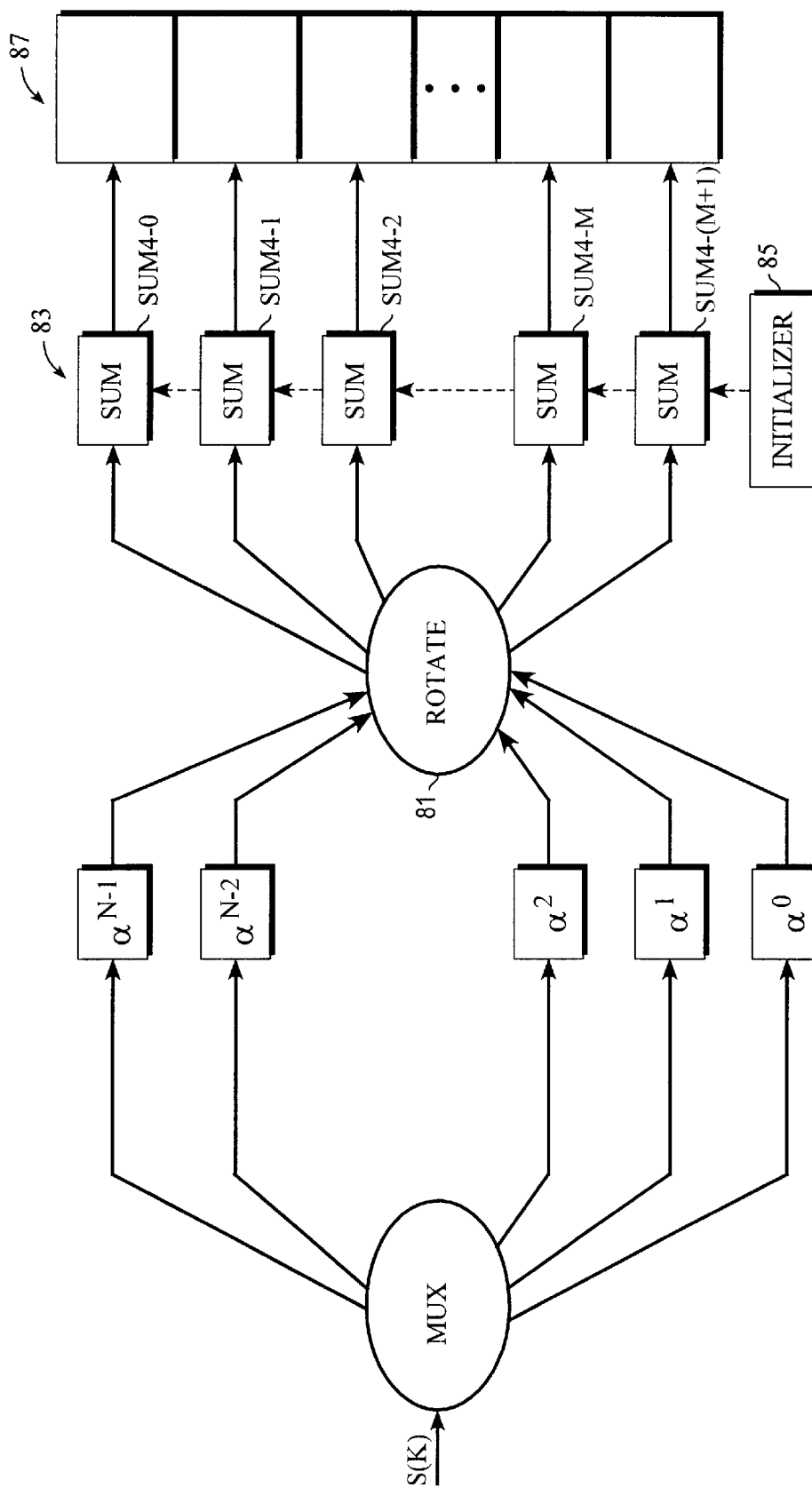

Any of these three prescriptions for (row,column) indices can be used together with the apparatus shown in FIGS. 7 and 8 to determine the Q-parity coefficients s0'[n1] and s1'[n1]. The alpha-exponent for the primitive α used to determine the coefficient s1'[n1], for a given data index k, is $$\alpha^{N-p-1},$$

for any of the three (row.column) indices prescriptions.

When the MUX 71 senses that all R2=(M+2)·N data element values s(k) have been received and that each has been fed to, and summed with the contents of, one of the sum modules SUM3-q, the MUX 71 causes a readout signal to be sent to each of the sum modules SUM3-q. Receipt of this readout signal causes each sum module SUM3-q to deposit its present content into a register or buffer unit BU3-q (q=0, 1, ..., M+1) in a third register 77. The content of the buffer unit BU3-q represents the Q-parity coefficient s0'[n2=q].

FIG. 8 illustrates apparatus suitable for calculating the Q-parity coefficients s1'[n1] according to the first embodiment. Each sum module SUM4-q (q=0, 1, 2, ..., M+1) in the assembly 83 is initialized by an initializer 85 to have content "0" before the computations begin. A stream of data element values s(k) (k=0, 1, ..., R−1), augmented by the values s(k) (k=R, ..., R2−1) computed in the P-parity calculations, and the corresponding index numbers "k" are received (normally in serial order) at a multiplexer 80. The multiplexer 80 directs the data element s(k) to an α-weighted multiplier MULT4-g(k), where $$g(k) = N - 1 - \{k \pmod{N}\} = (N - 1 - k) \pmod{N}. \quad (26)$$

is the column index p in an assembly 81 of such multipliers. The prescription set forth in Eq. (26) is equivalent to rotation of each the column n2=m in FIGS. 3A and 3B backward (from top to bottom) by m places (m=0, 1, ..., M+1) before the Q-parity syndrome components s1'[n2] are calculated, because of application of the modulo N to the α-exponent.

The multiplier MULT4-g(k) receives the data element s(k) and multiplies this data element by $\alpha^{g(k)}$, as indicated in FIG. 8. The α-weighted data element $s(k) \cdot \alpha^{g(k)}$ is then received by a rotate module 82 that directs this α-weighted data element to a sum element SUM4-h in an assembly 83 of sum elements. The sum element SUM4-h receives this α-weighted data element and adds this element to the sum of α-weighted data elements already received by this sum element. The initial value placed in the sum element SUM4-h by the initializer 85 is 0. The rotate module 82 directs the α-weighted data element $s(k) \cdot \alpha^{g(k)}$ to the sum element SUM4-q where q is the row index as determined in the preceding discussion.

When the rotate module 82 senses that R2=(M+2)·N data element values s(k) have been received and that each product $s(k) \cdot \alpha^{g(k)}$ has been fed to, and summed with the contents of, one of the sum modules SUM4-q, the rotate module 82 causes a readout of each of the sum modules SUM4-q into a register or buffer unit in a register assembly 87. The content of the register assembly 87 represents the Q-parity coefficient s1'[n2=q] (q=0, 1, ..., M+1).

FIGS. 9, 10, 11 and 12 illustrate suitable apparatus for processing the data elements s(k) (k=0000, 0001, ..., R−1) to determine the ECC P-parity, P-parity, Q-parity and Q-parity checkbytes, respectively, according to a second embodiment.

Figure 9:
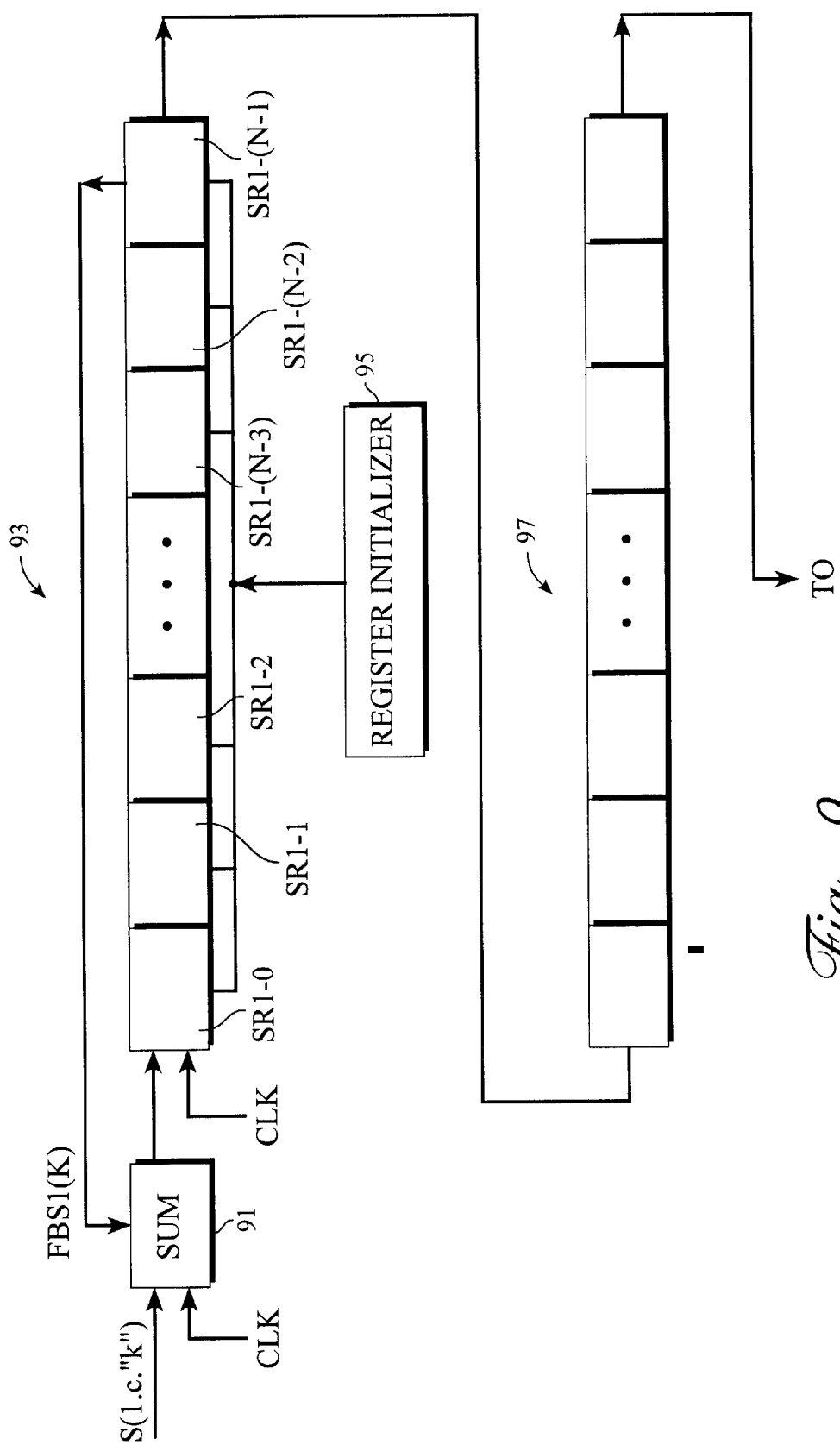

In FIG. 9, the data element values arrive in consecutive order at a first input terminal of a sum module 91, and a sum is formed of the new data element value and a value received, at a second input terminal of the sum module 91, from an N-unit feed-back shift register unit 95 that has feed-back capability. A shift register initializer 95 optionally initializes the contents of the shift register units in 93 so that each of the first N data elements to arrive at the sum module 91 is summed with a feedback value (initial) of 0. Each of the value sums formed by the sum module 91 is received by shift register unit SR1-0 and is then moved rightwards to the next buffer unit (SR1-0→SR1-1→SR1-2→ ... →SR1-(N−1)) upon receipt of the next clock pulse (CLK), which also drives the sum module 91, the feed-back shift register unit 95 and an N-unit first buffer 97 (optional). After N consecutive data elements have been read in, the first of these data element values, s(k=0), (or, more generally, a feedback sum FBS1(k)) is received from the feed-back shift register unit SR1-(N−1) by the sum module 91 and is summed with the data element value, s(k) (k=N, N+1, ... ) that is presently received at the first input terminal of the sum module 91. This sum is then received by the feedback shift register 93 at the next clock pulse, as before. This summation, shift and feedback process continues until all R data elements values s(k) (k=0, 1, ..., R−1) have been received at the sum module 91.

At least one of the sum module 91 and the first feedback shift register 93 is programmed to track the number K of data elements received and processed thus far. If $0 \leq K < R$, the first feed-back shift register unit 95 continues to shift the data element value sum FBS1(k) from the shift register unit SR1-(N−1) to the second input terminal of the sum module 91, where this data element value (sum) is added to the incoming data element value; and the new sum is again shifted into the shift register unit SR1-0 of the first feedback shift register 93. The sums FBS1(k) that accumulate in the shift register units SR1-m (m=0, 1, . . . , N−1) are the partial sums of the column entries corresponding to n1=N−1−m in FIG. 2.

When the count index K reaches K=R−1 for the first feedback shift register 93, the data element value sums in the first shift register units SR1-m (m=0, 1, . . . , N−1) now represent the components s0[n1] of the P-parity first syndrome s0, arranged in reverse order (n1=N−1−m). At this point, the first feedback shift register 95 no longer shifts the data element value sums to the sum module 91. Instead, the shift register 93 optionally (1) temporarily holds the contents of the N first shift register units SR1-m, without further feed-back or shift-forward, or (2) shifts these data element value sums s0[n1] into an N-unit first buffer 97, in consecutive order or (optionally) in reverse order.

Figure 10:
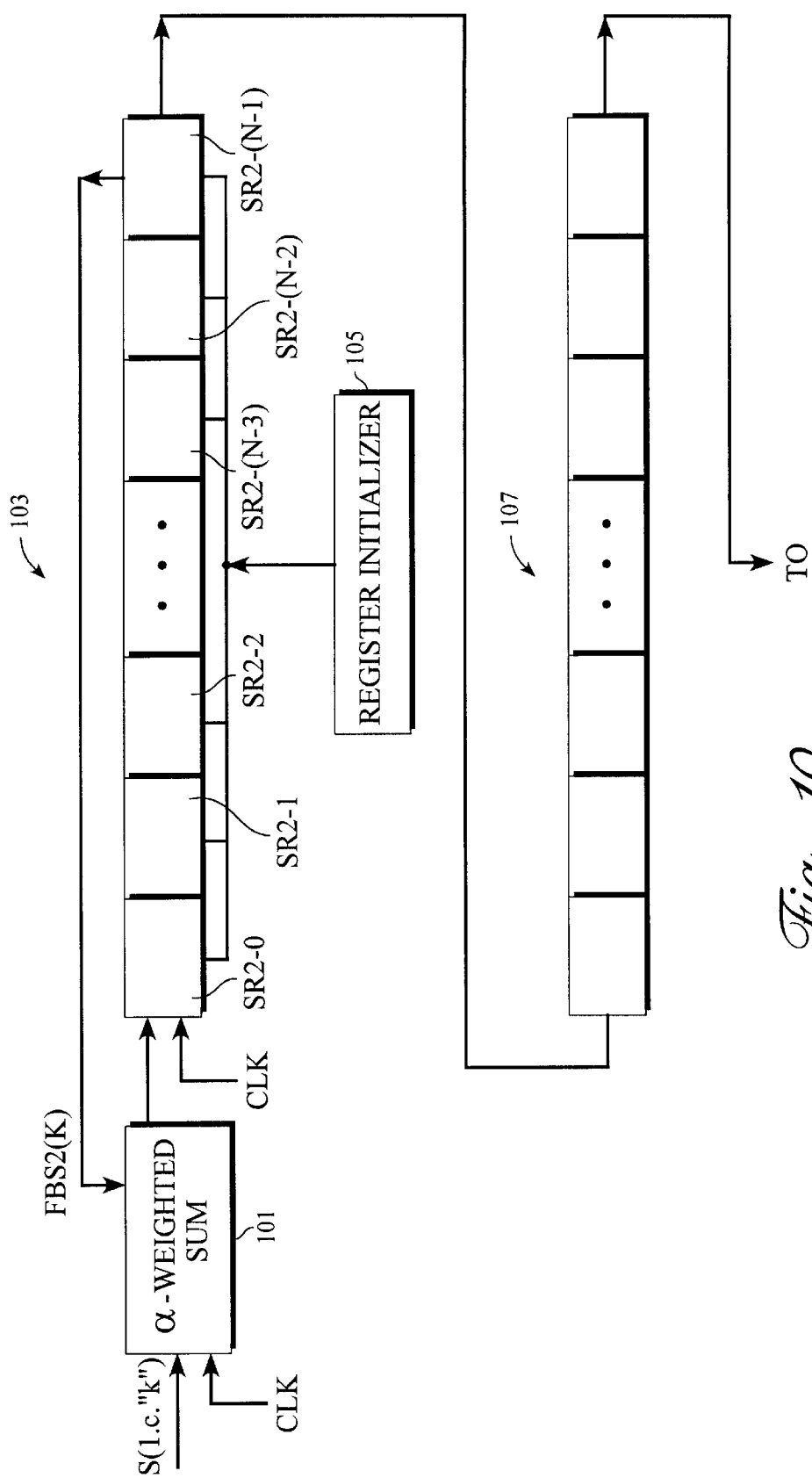

In FIG. 10, the data element values s(k) are received by an α-weighted sum module 101. A shift register initializer 107 optionally initializes the contents of the shift register units in a second feedback shift register 103 so that each of the first N data elements to arrive at the α-weighted sum module 101 is summed with a feedback value (initial) of 0. The data element values arrive in consecutive order at a first input terminal of the α-weighted sum module 101. The α-weighted sum module 101 forms sums of the data element value s(k), received at the first input terminal, and a term α·FBS2(k), where FBS2(k) is the value (initially zero) presently received at the second input terminal of the α-weighted sum module 101. With the data element index k=n1+N·n2, the α-weighted sum module 101 thus forms a sum of terms $$s(k)+\alpha \cdot FBS2(k)=s(n1+N \cdot n2)+\alpha^1 \cdot s(n1+N \cdot (n2-1))+\alpha^2 \cdot s(n1+N \cdot (n2-2))+ \ldots +\alpha^{43-1} \cdot s(n1+N \cdot (n2-(N-1))), \quad (27)$$

weighted by powers of the 8-bit array α, where the sum on the right is discontinued when the first argument n1+N·(n2−p) becomes negative. Each of the value sums, s(k)+α·FBS2 (k), formed by the α-weighted sum module 101 is received by shift register unit SR2-0 and is then moved rightwards to the next buffer unit (SR2-0→SR2-1→SR2-2→ . . . →SR2-(N−1) ) upon receipt of the next clock pulse (CLK), which also drives the α-weighted sum module 101, the second feed-back shift register unit 103 and an N-unit second buffer 107 (optional). After N consecutive data elements have been read in, the first of these data element values, s(k=0), is received from the feed-back shift register unit SR2-(N−1) by the α-weighted sum module 101, is multiplied by α, and is summed with the data element value, s(k=N), that is presently received at the first input terminal of the α-weighted sum module 101. This weighted sum is then received by the feedback shift register 103 at the next clock pulse, as before. This weighted sum, shift and feedback process continues until all R data elements values s(k) (k=0, 1, . . . , R−1) have been received at the α-weighted sum module 101.

At least one of the α-weighted sum module 101 and the second feedback shift register 103 is programmed to track the number K of data elements received and processed thus far. If 0≦K<R, the second feed-back shift register unit 103 continues to shift the data element value (sum) from the shift register unit SR1-(N−1) to the second input terminal of the α-weighted sum module 101, where this data element value (sum) is multiplied by α and the resulting product is added to the incoming data element value; and the new weighted sum is again shifted into the shift register unit SR2-0 of the second feedback shift register 103. The sums that accumulate in the shift register units SR2-m (m=0, 1, . . . , N−1) are the partial sums of the α-weighted column entries corresponding to n1=N−1−m in FIG. 2.

When the count index k reaches k=R−1 for the second feedback shift register 103, the data element value sums in the second shift register units SR-m (m=0, 1, . . . , N−1) now represent the components s1[n1] of the second syndrome, arranged in reverse order (n1=N−1−m). At this point, the second feedback shift register 103 no longer shifts the data element value sums to the weighted sum module 101. Instead, the shift register unit 103 optionally (1) temporarily holds the contents of the N second shift register units SR2-m, without further feed-back or shift-forward, or (2) shifts these data element value sums s1[n1] into an N-unit second buffer 107 (optional), in consecutive order or (optionally) in reverse order. The contents of the first buffer 97 and of the second buffer 107 are transferred, as 2N additions to the stream of data element values s(k) (k=0, 1, . . . , R−1), to a sum module 111 (FIG. 11) and an α-weighted sum/permutation module 121 (FIG. 12), respectively. The contents of the first buffer 97 and second buffer 107 are also transferred to a syndrome processing module 80 that will compute the checkbyte components c0[n1] and c1[n1].

In the preceding discussion of FIGS. 9 and 10, the respective general numbers M, M+2, N−1, N, 2·N, M·N−1 and (M+2)·N−1 may be replaced by particular choices, such as the respective numbers 24, 26, 42, 43, 86, 1031 and 1117.

Figure 11:
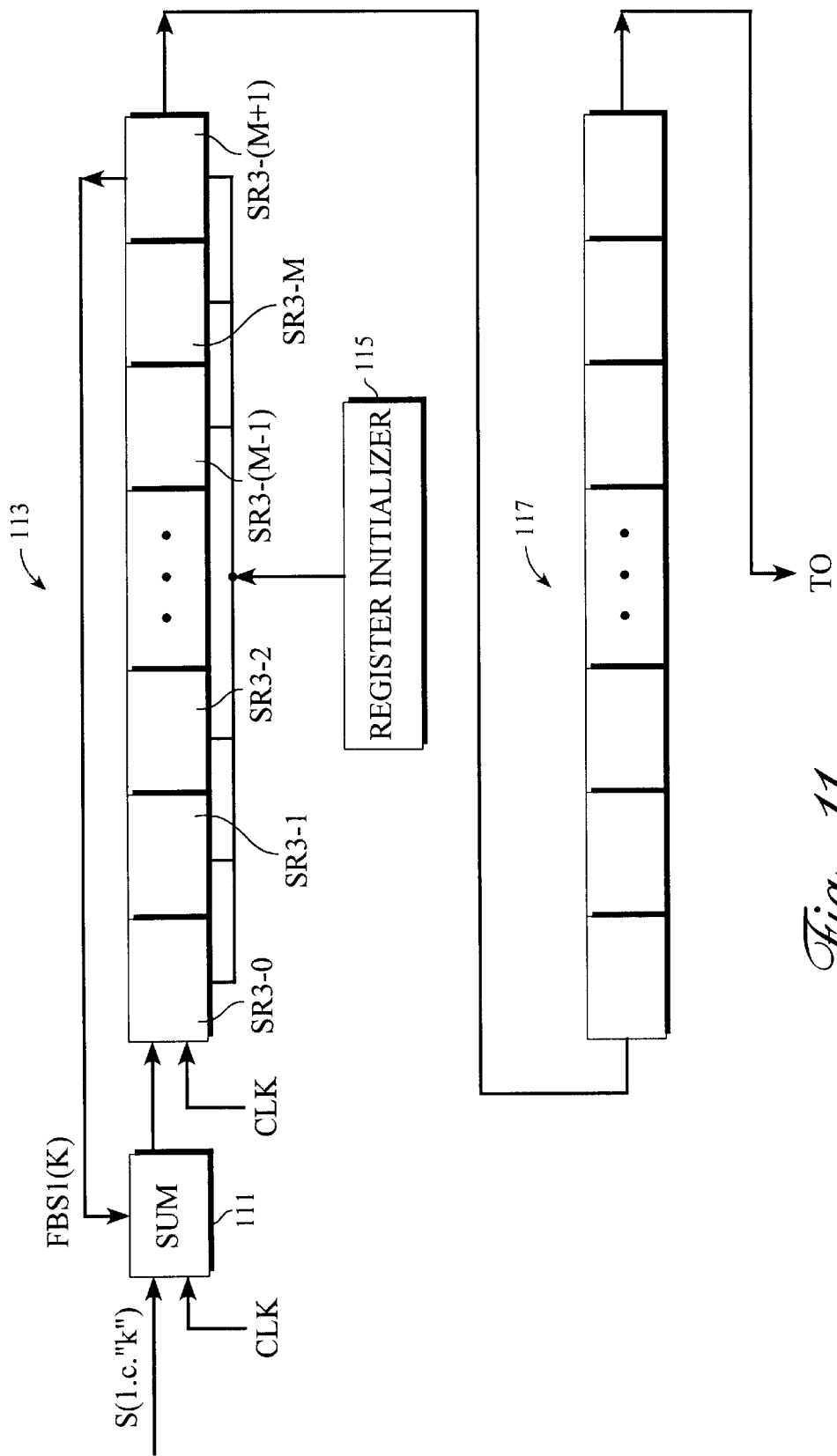
Figure 12:
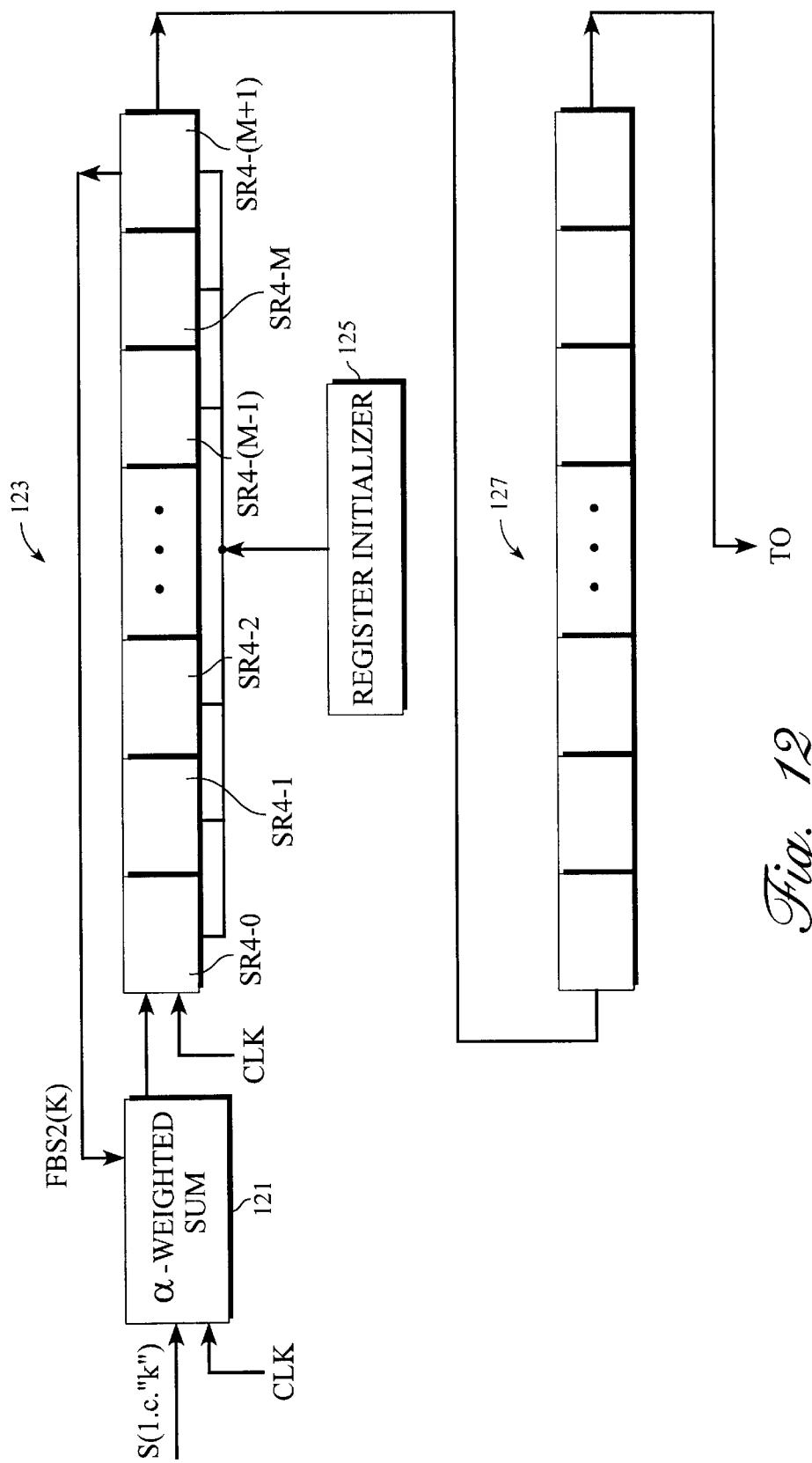

FIGS. 11 and 12 illustrate a second embodiment of apparatus for processing the data elements s(k) (k=0000, 0001, . . . , R−1, R, . . . , R2−1), including the supplemental or augmented data element values s(k) corresponding to k=R, R+1, . . . , R2−1, for ECC Q-parity. The operation of the system in FIG. 11, which provides the components s0'[n2] of the first syndrome s0' for Q-parity, is similar, in part, to operation of the apparatus shown in FIG. 9, with the following difference: the N-unit first feedback shift register 93 in FIG. 9 is replaced by an (M+2)-unit third feedback shift register 113 that feeds the contents FBS3(k) of this last shift register unit SR3-(M+1) to the second input terminal of a sum-module 111.

Similarly, the operation of the system in FIG. 12, which provides the components s1'[n2] of the first syndrome s1' for Q-parity, is similar, in part, to operation of the apparatus shown in FIG. 10, with the following difference: the N-unit first feedback shift register 103 in FIG. 10 is replaced by an (M+2)-unit third feedback shift register 123 that feeds the contents FBS4(k) of this last shift register unit SR4-(M+1) to the second input terminal of a sum module 121. The sum modules, 111 and 121, and the third and fourth feedback shift registers, 113 and 123, are arranged to operate according to the following requirements.

The data elements s(k) (k=0, 1, . . . , R−1) are received and processed at the first input terminal of the sum module 111. The sum module 113 also receives feedback from the register unit SR3-(M+1) at a second input terminal, in the same manner as the second input terminal of the sum module 111 receives feedback from the register unit SR3-(M+1) in FIG. 5. When the count index k reaches K=R−1, the data element values s(k) with k=R, R+1, . . . , R2−1 (stored in the buffers 117 and 127) are added to the stream of data elements received at the first input terminal of the sum module 111. When the count index K reaches K=R2−1, the data element value sums in the third shift register units SR3-m (m=0, 1, . . . , M+1) now represent the components of the first Q-parity syndrome s0'[n2], arranged in reverse order. At this point, the third feedback shift register 115 no longer shifts the data element sums to the sum module 111. Instead, the third feedback shift register unit 115 optionally (1) temporarily holds the contents of its M+2 units, without further feed-back or shift-forward, or (2) shifts these data element value sums s0'[n2] into an (M+2)-unit third buffer 117 (optional), in consecutive order or (optionally) in reverse order.

Computation of the components of the second Q-parity syndrome s1'[n2] are more complex, because of the combined presence of the factors $\alpha^{N-1-n1}$ and $s((N+1)\cdot n1+N\cdot n2)_{R2}$ in the expressions for s1'[n2] in the relation (9). The data element stream s(k) (k=0, 1, . . . , R−1) is received at a first input terminal of an α-weighted sum module 121, which receives a feedback value, FBS4(k), at a second input terminal. The α-weighted sum module 121 determines an integer solution pair (n1(k),n2(k)) for the relation $$k=((N+1)\cdot n1+N\cdot n2)_{R2}=((N+1)\cdot n1+N\cdot n2) \pmod{R2}, \quad (28)$$

with $0 \leq n1(k) \leq N-1$ and $0 \leq n2(k) \leq M+1$, forms an α-weighted sum $\alpha^{M-1-n1} \cdot s(k)+FBS4(k)$, and passes this weighted sum to an (M+2)-unit fourth feedback shift register 123. The fourth feedback shift register 123 is optionally initialized by a fourth initializer 125, which initially places a zero value in each of the M+2 shift register units SR4-m (m=0, 1, . . . , M+1). Thus, the first M+2 feedback values FBS4(k) (k=0, 1, . . . , M+1) are 0.

A data element s(k) and its associated index k are provided at the α-weighted sum-module 121, and the relation (28) is to be solved for an integer solution pair (n1(k),n2(k)). As noted in connection with the discussion of the argument in the relation (9), the relation (28) has a unique solution pair (n1,n2) with $0 \leq n1 \leq N$ and $0 \leq n2 \leq M+1$. The solution pair (n1(k),n2(k)) for the relation (28) can be solved explicitly, using well known number theoretic methods, or the solution pair (n1(k),n2(k)) can be provided by table look-up. Once the solution pair (n1(k),n2(k)) is known for the index k and for the data element s(k), the weight $\alpha^{M-1-n1}$ can be provided and multiplied by the element s(k), from the relations (19A)–(25), to form the weighted data element $$\alpha^{M-1-n1} \cdot s((N+1)\cdot n1+N\cdot n2)_{R2},$$

which is then passed to the fourth feedback shift register 123 for appropriate feedback.

After the augmented data element stream with all R2 data element values has been received, and a-weighted sums have been formed by the α-weighted sum module 121 and passed to the fourth feedback shift register 123, the feedback path is disabled, the M+2 sum register units SR4-m (m=0, 1, . . . , M+1) hold the components of the second Q-parity syndrome s1'[n2], arranged in reverse order. The fourth feedback shift register 123 optionally (1) temporarily holds the contents of its M+2 units, without further feed-back or shift-forward, or (2) shifts these data element sums s1'[n2] into an (M+2)-unit fourth buffer 127 (optional).

The P-parity calculations of the syndrome components s0[n1] and s1[n1] (n1=0, 1, . . . , N−1) are computed as in the discussion of FIGS. 4 and 5, using the relations (4) and (5) and only the original coefficients s(k) (k=0, 1, . . . , R−1), with R=M·N=1032 in the example. The P-parity components are computed using the preceding formalism (e.g., as in FIGS. 9 and 10) and do not require any changes in the approach of the first embodiment.

The Q-parity syndrome components s0'[n2] and s1'[n2] (n2=0, 1, . . . , M+1) are computed in this second embodiment as in the relations (8) and (9), including the original coefficients s(k) (k=0, 1, . . . , R−1) and the P-parity checkbyte components c0[n1] and c1[n1], which are again re-designated as new coefficients s(R+n1) and s(R+N+n1), respectively, for convenient reference.

The four feedback shift registers, 93, 103, 113 and 123, or, alternatively, the four buffers, 97, 107, 117 and 127, now hold the respective components s0[n1], s1[n1], s0'[n2] and s1'[n2], in reverse order or (optionally) in forward order. The components s0[n1] and s1[n1] are read out and received by the syndrome processing module 130, shown in FIG. 13, to compute the P-parity code words c0[n1] and c1[n1], as indicated in the relations (6) and (7).

Sub-systems from the first and second embodiments can be mixed, if desired. For example, the sub-systems containing the MUX 51, α-weighted MUX 61, and sum modules SUM1-p and SUM2-p of the first embodiment can be exchanged with the sub-systems containing the sum module 91, α-weighted sum module 101 and shift registers 93 and 103; and/or the sub-systems containing the MUX 71, α-weighted MUX 81, and sum modules SUM3-p and SUM4-p of the first embodiment can be exchanged with the sub-systems containing the sum module 111, α-weighted sum module 121 and shift registers 113 and 123.

For computation of the P-parity code words, the components s0[n1] and s1[n1] are received at first and second input terminals of the syndrome processing module 80, weighted sums $\alpha^{230} \cdot s0[n1]+\alpha^{232} \cdot s1[n1]$ and $\alpha^{231} \cdot s0[n1]+\alpha^{232} \cdot s1[n1]$ are computed at first and second α-weighted sum modules, 131 and 133, respectively, and these α-weighted sums are held in memory units, 135 and 137, or are presented for immediate use at output terminals of the syndrome processing module 130.

Figure 13:
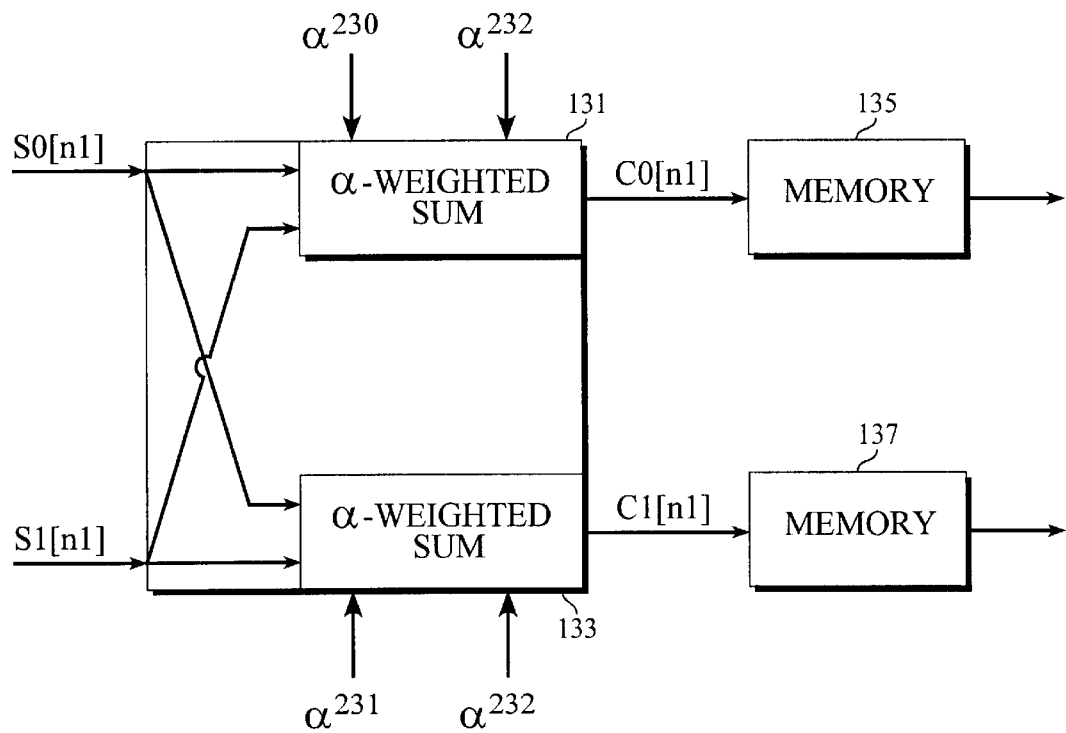
FIGS. 13 and 14 schematically illustrate use of syndrome components s0[n2], s1[n2], s0'[n1] and s1'[n1], to form the appropriate checkbyte components c0[n2], c1[n2], c0'[n1] and c1'[n1].
Figure 14:
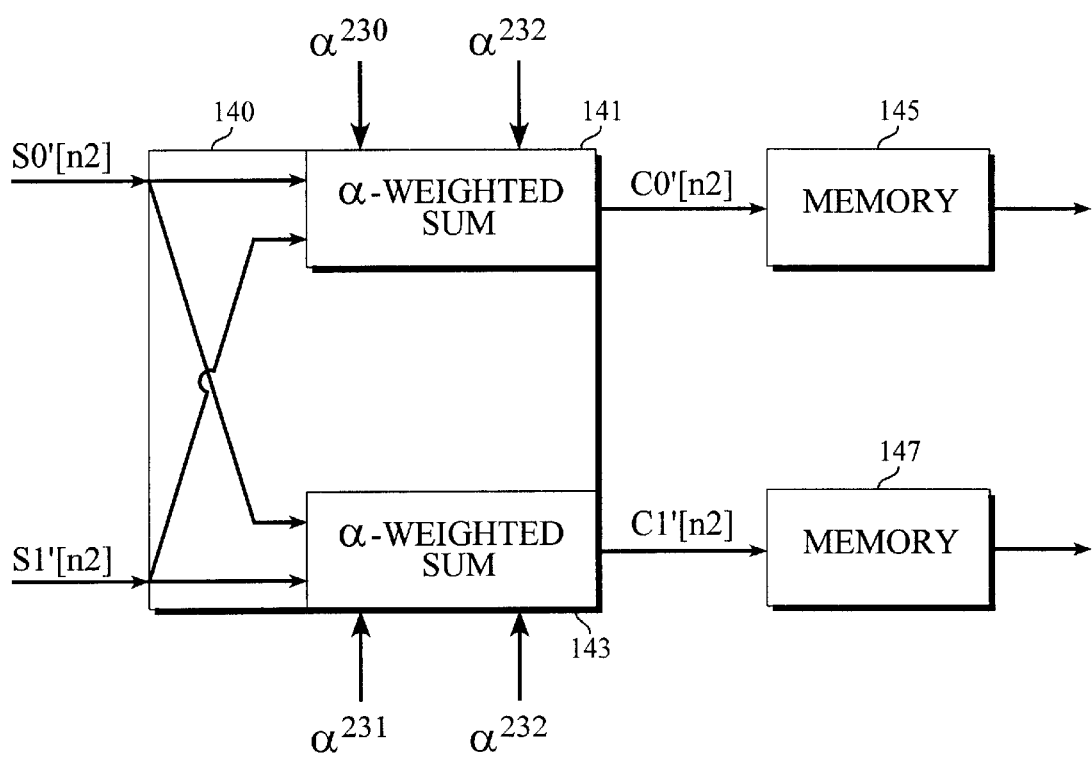

The components s0'[n2] and s1'[n2] are read out and received by an syndrome processing module 140, analogous to 130 in FIG. 13, and the corresponding components 141, 143, 145 and 147, in FIG. 14 to form the Q-parity code words c0'[n2] and c1'[n2], which are computed according to the relations $$c0'[n2]=\alpha^{230} \cdot s0'[n2]+\alpha^{232} \cdot s1'[n2] \quad (n2=0, 1, \ldots, M+1), \quad (29)$$

$$c1'[n2]=\alpha^{231} \cdot s0'[n2]+\alpha^{232} \cdot s1'[n2]. \quad (30)$$

Alternatively, the same syndrome processing module 130 (FIG. 13) can be used to compute the P-parity code words, c0[n1] and c1[n1], and the Q-parity code words, c0'[n2] and c1'[n2].

Figure 15A:
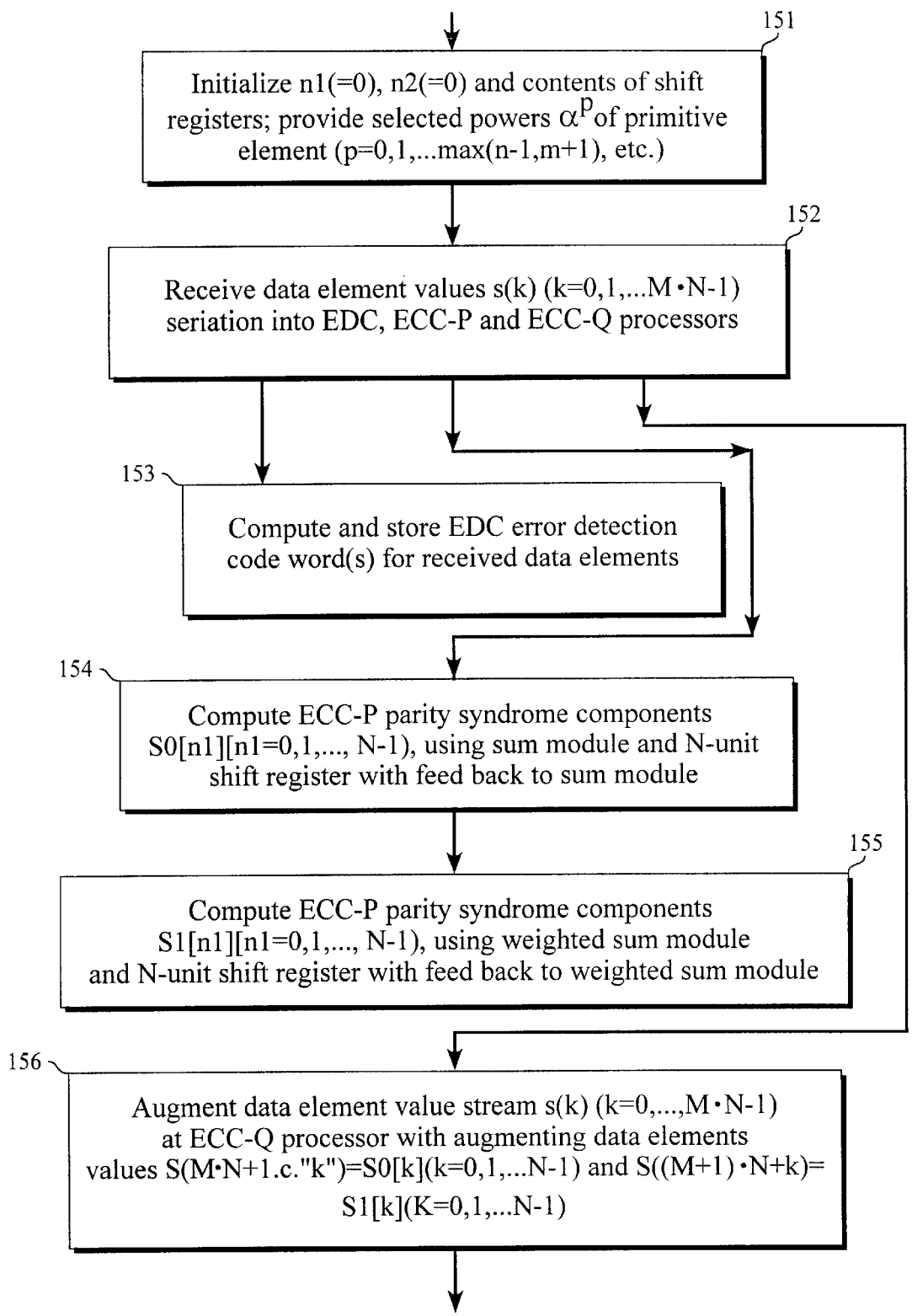
FIGS. 15A and 15B are a flow chart illustrating a procedure suitable for simultaneously forming the EDC checkbytes and the ECC-P-parity and ECC-Q-parity syndromes and checkbytes.
Figure 15B:
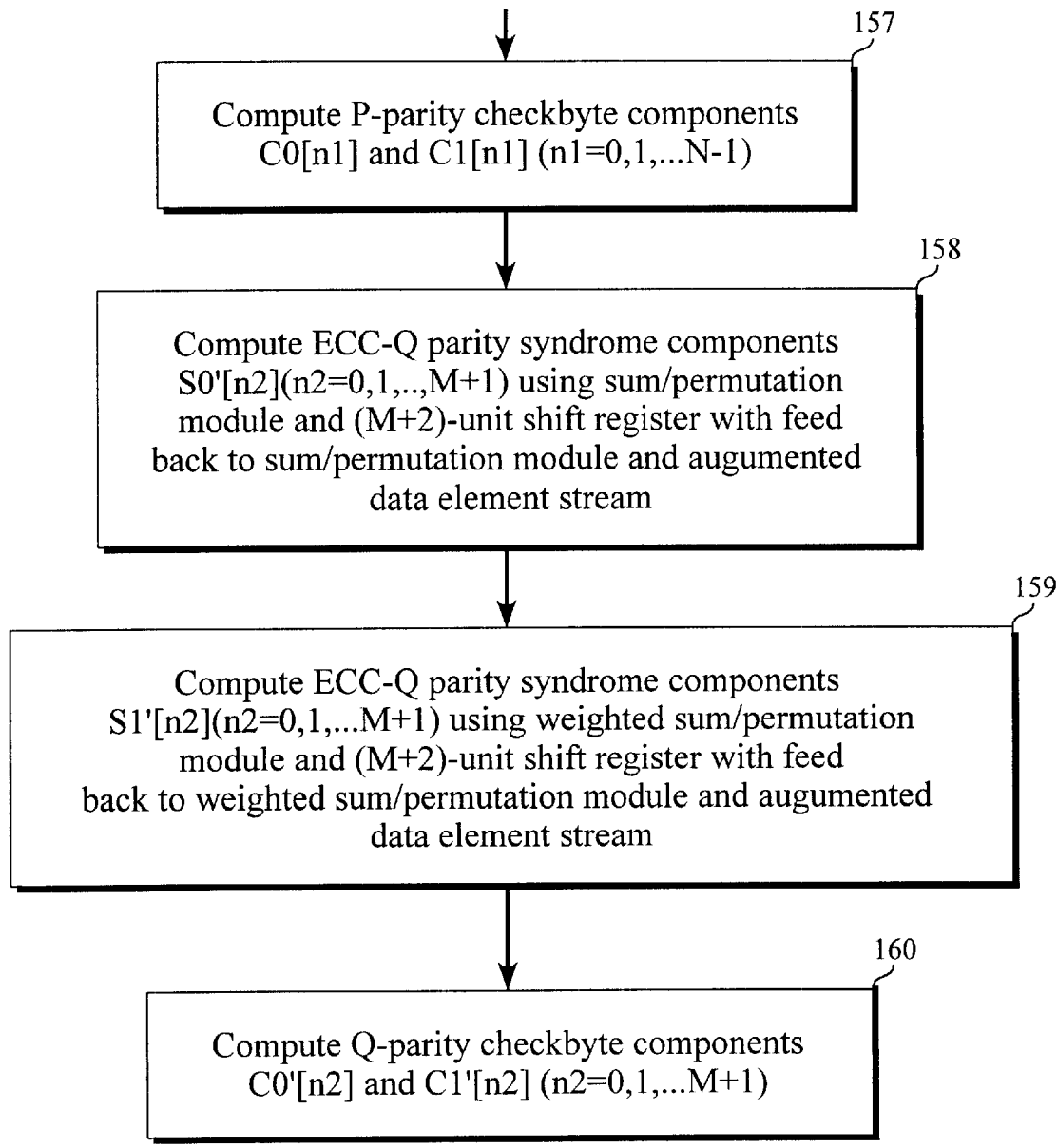

FIGS. 15A and 15B are a flow chart of a procedure, generalized to selected positive integers M and N, for simultaneously generating the EDC code word(s), the ECC-P code words and the ECC-Q code words for error control. The integers N and N+1 are relatively prime to each other. In step 151 (optional), each of the variables n1 and n2 is initialized to 0, and the contents of first, second, third and fourth feedback registers (with respective sizes N, N, M+1 and M+1) are initialized. Selected powers $\alpha^p$ (p=0, 1, . . . , max(N−1,M+1) and others) are provided or computed.

In step 152, a stream of data element values s(k) (k=0, 1, . . . , R−1) is received seriatim (in forward order or backward order) at a first input terminal of each of an EDC processor, an ECC-P processor and an ECC-Q processor. In step 153, one or more EDC error detection checkbytes is computed and stored for the stream of data element values.

In step 154, the ECC-P processor computes ECC-P parity syndrome components s0[n1], preferably using a sum module and (first) N-unit feedback shift register with feedback to the sum module, as discussed in connection with FIG. 5.

In step 155, the ECC-P processor computes ECC-P parity syndrome components s1[n1], preferably using an α-weighted sum module and (second) N-unit feedback shift register with feedback to the weighted sum module, as discussed in connection with FIG. 10.

In step 156, the stream of data element values s(k) (k=0, 1, ..., R−1) at the ECC-Q processor is augmented using augmenting data element values s(M·N+k)=s0'[k] and s((M+1)·N+k)=s1'[k] for k=0, 1, ..., N−1. In step 157, ECC-P parity checkbytes c0[n1] and c1[n1] (n1=0, 1, ..., N−1) are computed by analogy with the relations (6) and (7).

In step 158, the ECC-Q processor computes ECC-Q parity syndrome components s0'[n2], preferably using a sum module and (third) (M+2)-unit feedback shift register with feedback to the sum module, as discussed in connection with FIG. 11.

In step 159, the ECC-Q processor computes ECC-Q parity syndrome components s1'[n2], preferably using an α-weighted sum module and (fourth) (M+2)-unit feedback shift register with feedback to the α-weighted sum module, as discussed in connection with FIG. 12.

In step 160, ECC-Q parity checkbytes c0'[n2] and c1'[n2] (n2=0, 1, ..., M+1) are computed by analogy with the relations (13) and (14).

The groups of steps {152}, {153, 154, 155} and {156, 157, 158, 159} are, or may be, performed substantially simultaneously according to the invention.

Proceeding in this manner, the EDC, ECC-P and ECC-Q checkbytes can be generated in parallel by three data element value processors that work in parallel and simultaneously receive and process the stream of data element values s(k) (k=0, 1, ..., R−1). Computation of the ECC-Q code words may need to be delayed in time, relative to computation of the ECC-P code words, because the ECC-P code word components s0[n1] and s1[n1] are computed and used to augment the stream of data element values for the ECC-Q processor. However, these augmenting data element values are needed only at the end of the data element value stream for the ECC-Q processor (step 156 in FIG. 15 so that the associated time delay is likely to be minimal or non-existent. In effect, the system provides triple duty simultaneous processing to compute the EDC, ECC-P and ECC-Q checkbytes.

What is claimed is:

1. A system for processing data for error control purposes, the system comprising:

a first module that receives a sequence of data elements s(k), numbered k=0, 1, ..., M·N−1, as a stream, where M and N are selected positive integers, and computes an EDC factor for the sequence;

a second module that receives the sequence of data elements s(k), simultaneously with receipt of the data element sequence by the first module, and computes P-parity syndrome components, s0[n1] and s1[n1] (n1=0, 1, ..., N−1) and P-parity checkbytes c0[n1] and c1[n1], where the second module comprises:

a first sum module having at least N signal summers, numbered n1=0, 1, ..., N−1, wherein at least one of the N signal summers, numbered p (0≦p≦N−1), forms a sum of the data elements s(k) for which k (mod N)=p; and a second sum module having at least N weighted signal summers, numbered n1=0, 1, ..., N−1, wherein at least one of the weighted signal summers, numbered p' (0≦p'≦N−1), forms a weighted sum of data elements s(k)·α$^{M-1-[k/N]int}$, where [w]$_{int}$ is a floor function for any real number w, and α is an element drawn from an algebraic field and satisfying a selected polynomial relation P(α)=0; and a third module that receives the sequence of data elements s(k), simultaneously with receipt of the data element sequence by the first module, receives the P-parity syndrome components, and computes Q-parity syndrome coefficients, s0'[n2] and s1'[n2] (n2=0, 1, ..., M+1).

2. The system of claim 1, wherein at least one of said second module and said third module computes Q-parity checkbytes c0'[n2] and c1'[n2], using information from said Q-parity syndrome coefficients s0'[n2] and s1'[n2].

3. The system of claim 1, wherein said third module comprises:

a sum module having at least M+2 signal summers, numbered n2=0, 1, ..., M+1, wherein at least one of the M+2 signal summers, numbered q (0≦q≦M+1), forms a sum of said data elements s(k) for which said index k satisfies the relation k=((N+1)·p+N·q)(mod ((M+2)·N)).

4. The system of claim 1, wherein said third module comprises:

a sum module having at least M+2 signal summers, numbered n2=0, 1, ..., M+1, wherein at least one of the M+2 signal summers, numbered q (0≦q≦M+1), forms a sum of said data elements s(k) for which said index k satisfies the relation q=(m·(N+1)−k)(mod M+2).

5. The system of claim 1, wherein said third module comprises:

a third sum module having at least M+2 signal summers, numbered n2=0, 1, ..., M+1, wherein at least one signal summer in the third sum module, numbered q (0≦q≦M+1), forms a sum of said data elements s(k) for which f(k)=q (0≦q≦M+1), where f(k) is a function defined by the relations $$f(k) = N1 \cdot m - k$$
$$(N \cdot m \leq k < N1 \cdot (m+1);\ m = 0, 1, 2, \ldots, M+1)$$
$$= (N1 \cdot m - k)_{M2}$$
$$(N1 \cdot m + 1 \leq k \leq N1 \cdot m + M2;\ m = 0, 1, \ldots, M+1)$$
$$= (N1 \cdot m - k)_{M2}$$
$$(N1 \cdot m + M2 + 1 \leq k \leq N1 \cdot m + N - 1 - m;$$
$$m = 0, 1, \ldots, N - M - 4)$$
$$= (N1 \cdot m - k)_{M2}$$
$$(m \cdot N1 + 1 \leq k \leq N \cdot m + N - 1);$$
$$m = N - M - 3, \ldots, M + 1),$$
$$m = [k/N]_{int},$$

where N1=N+1, M2=M+2, [w]$_{int}$ is a floor function and (w)$_{M2}$=w(mod M2) for any real number w.

6. The system of claim 5, wherein said third module comprises:

a fourth sum module having at least M+2 weighted signal summers, numbered n2=0, 1, ..., M+1, wherein at least one of the weighted signal summers in the fourth sum module, numbered q' (0≦q'≦M+1), forms a weighted sum of said data elements s(k)·α$^{(N-1-k)(mod\ N)}$ for which said function f(k)=q' (0≦q≦M+1).

7. The system of claim 1, wherein said third module comprises:

a third sum module having at least M+1 signal summers, numbered n2=0, 1, ..., M+1, wherein a first signal summer forms a sum of said data elements s(k) for which k is expressible as an integer {n1·(N+1)+n2·N} (mod R2), with n2 fixed and n1=0, 1, ..., N−1, where M ($\geq 2$) and N ($\geq 2$) are relatively prime integers and R2=(M+2); and a fourth sum module having at least M+1 weighted signal summers, numbered n2=0, 1, ..., M+1, wherein a weighted signal summer in the fourth sum module forms a weighted sum of said data elements s(k)·$\alpha^{N-1-n1}$ for which k is expressible as an integer {n1·(N+1)+n2·N}(mod R2), with n2 fixed and n1=0, 1, ..., N−1, M ($\geq 2$) and N ($\geq 2$) are relatively prime integers, and R2=(M+2)·N.

8. A method for processing data for error control purposes, the method comprising:

receiving, at a first module, a sequence of data elements s(k), numbered k=0, 1, ..., M·N−1, as a stream, where M and N are selected positive integers, and computing an EDC factor for the sequence;

receiving, at a second module, the sequence of data elements s(k), simultaneously with receipt of the data element sequence by the first module, and computing P-parity syndrome components, s0[n1] and s1[n1] (n1=0, 1, ..., N−1) and P-parity checkbytes c0[n1] and c1[n1], wherein said second module comprises:

a first sum module having at least N signal summers, numbered n1=0, 1, ..., N−1, wherein at least one of the N signal summers, numbered p ($0 \leq p \leq N-1$), forms a sum of the data elements s(k) for which k (mod N)=p; and a second sum module having at least N weighted signal summers, numbered n1=0, 1, ..., N−1, wherein at least one of the weighted signal summers, numbered p' ($0 \leq p' \leq N-1$), forms a weighted sum of data elements s(k)·$\alpha^{M-1-[k/N]int}$, where $[w]_{int}$ is a floor function for any real number w, and $\alpha$ is an element drawn from an algebraic field and satisfying a selected polynomial relation P($\alpha$)=0; and receiving, at a third module, the sequence of data elements s(k), simultaneously with receipt of the data element sequence by the first module, receiving the P-parity syndrome components from the second module, and computing Q-parity syndrome coefficients, s0'[n2] and s1'[n2] (n2=0, 1, ..., M+1).

9. The method of claim 8, further comprising computing, at at least one of said second module and said third module, Q-parity checkbytes c0'[n2] and c1'[n2], using information from said Q-parity syndrome coefficients s0'[n2] and s1'[n2].

10. The method of claim 8, further comprising providing said third module with a sum module having at least M+2 signal summers, numbered n2=0, 1, ..., M+1, wherein at least one of the M+2 signal summers, numbered q ($0 \leq q \leq M+1$), forms a sum of said data elements s(k) for which said index k satisfies the relation k=((N+1)·p+N·q)(mod((M+2)·N)).

11. The method of claim 8, further comprising providing said third module with a sum module having at least M+2 signal summers, numbered n2=0, 1, ..., M+1, wherein at least one of the M+2 signal summers, numbered q ($0 \leq q \leq M+1$), forms a sum of said data elements s(k) for which said index k satisfies the relation q=(m·(N+1)−k)(mod M+2).

12. The method of claim 8, further comprising providing said third module with a third sum module having at least M+2 signal summers, numbered n2=0, 1, ..., M+1, wherein at least one signal summer in the third sum module, numbered q ($0 \leq q \leq M+1$), forms a sum of said data elements s(k) for which f(k)=q ($0 \leq q \leq M+1$), where f(k) is a function defined by the relations $$f(k) = N1 \cdot m - k$$
$$(N \cdot m \leq k < N1 \cdot (m+1); \quad m = 0, 1, 2, \ldots, M+1)$$
$$= (N1 \cdot m - k)_{M2}$$
$$(N1 \cdot m + 1 \leq k \leq N1 \cdot m + M2; \quad m = 0, 1, \ldots, M+1)$$
$$= (N1 \cdot m - k)_{M2}$$
$$(N1 \cdot m + M2 + 1 \leq k \leq N1 \cdot m + N - 1 - m;$$
$$m = 0, 1, \ldots, N - M - 4)$$
$$= (N1 \cdot m - k)_{M2}$$
$$(m \cdot N1 + 1 \leq k \leq N \cdot m + N - 1);$$
$$m = N - M - 3, \ldots, M + 1),$$
$$m = [k/N]_{int},$$

where N1=N+1, M2=M+2, $[w]_{int}$ is a floor function and $(w)_{M2}$=w(mod M2) for any real number w.

13. The method of claim 12, further comprising providing said third module with a fourth sum module having at least M+2 weighted signal summers in the fourth sum module, numbered n2=0, 1, ..., M+1, wherein at least one of the M+2 weighted signal summers, numbered q' ($0 \leq q' \leq M+1$), forms a weighted sum of said data elements $\alpha^{(N-1-k)(mod \, N)}$·s(k) for which said function f(k)=q'·($0 \leq q' \leq M+1$) [, where $\alpha$ is an element drawn from an algebraic field and satisfying a selected polynomial relation P($\alpha$)=0].

14. The method of claim 8, further comprising:

providing said third module with a third sum module having at least M+1 signal summers, numbered n2=0, 1, ..., M+1, wherein a first signal summer forms a sum of said data elements s(k) for which k is expressible as an integer {n1·(N+1)+n2·N}(mod R2), with n2 fixed and n1=0, 1, ..., N−1, where M ($\geq 2$) and N ($\geq 2$) are relatively prime integers and R2=(M+2)·N; and providing said third module with a fourth sum module having at least M+1 weighted signal summers, numbered n2=0, 1, ..., M+1, wherein a weighted signal summer in the fourth sum module forms a weighted sum of said data elements s(k)·$\alpha^{N-1-n1}$ for which k is expressible as an integer {n1·(N+1)+n2·N}(mod R2), with n2 fixed and n1=0, 1, ..., N−1, M ($\geq 2$) and N ($\geq 2$) are relatively prime integers, and R2=(M+2)·N.

15. A system for processing data for error control purposes, the system comprising:

a first module that receives a sequence of data elements s(k), numbered k=0, 1, ..., M·N−1, as a stream, where M and N are selected positive integers, and computes an EDC factor for the sequence;

a second module that receives the sequence of data elements s(k), simultaneously with receipt of the data element sequence by the first module, and computes P-parity syndrome components, s0[n1] and s1[n1] (n1=0, 1, ..., N−1) and P-parity checkbytes c0[n1] and c1[n1], wherein said second module comprises:

a first sum module having at least N signal summers, numbered n1=0, 1, ..., N−1, wherein at least one signal summer forms a sum of the data elements s(k=n1+n2·N), with n1 fixed and n2=0, 1, ..., M−1, where M ($\geq 2$) and N ($\geq 2$) are relatively prime integers; and a second sum module having at least N weighted signal summers, numbered n1=0, 1, ..., N−1, wherein at least one signal summer forms a weighted sum of data elements of the form $s(k) \cdot \alpha^{M-1-[k/N]_{int}}$ with $k=n1+N \cdot n2$ with n1 fixed and n2=0, 1, ..., M−1, where $[w]_{int}$ is a floor function, α is an element drawn from an algebraic field and satisfying a selected polynomial relation P(α)=0, and M (≧2) and N (≧2) are relatively prime integers; and, a third module that receives the sequence of data elements s(k), simultaneously with receipt of the data element sequence by the first module, receives the P-parity syndrome components, and computes Q-parity syndrome coefficients, s0'[n2] and s1'[n2] (n2=0, 1, ..., M+1).

16. A method for processing data for error control purposes, the method comprising:

receiving, at a first module, a sequence of data elements s(k), numbered k=0, 1, ..., M·N−1, as a stream, where M and N are selected positive integers, and computing an EDC factor for the sequence;

receiving, at a second module, the sequence of data elements s(k), simultaneously with receipt of the data element sequence by the first module, and computing P-parity syndrome components, s0[n1] and s1[n1] (n1=0, 1, ..., N−1) and P-parity checkbytes c0[n1] and c1[n1], wherein said second module comprises:

a first sum module having at least N signal summers, numbered n1=0, 1, ..., N−1, wherein at least one signal summer forms a sum of the data elements s(k=n1+n2·N), with n1 fixed and n2=0, 1, ..., M−1, where M (≧2) and N (≧2) are relatively prime integers; and a second sum module having at least N weighted signal summers, numbered n1=0, 1, ..., N−1, wherein at least one signal summer forms a weighted sum of data elements of the form $s(k) \cdot \alpha^{M-1-[k/N]_{int}}$ with $k=n1+N \cdot n2$ with n1 fixed and n2=0, 1, ..., M−1, where $[w]_{int}$ is a floor function, α is an element drawn from an algebraic field and satisfying a selected polynomial relation P(α)=0, and M (≧2) and N (≧2) are relatively prime integers; and, receiving, at a third module, the sequence of data elements s(k), simultaneously with receipt of the data element sequence by the first module, receiving the P-parity syndrome components, and computing Q-parity syndrome coefficients, s0'[n2] and s1'[n2] (n2=0, 1, ..., M+1).

\* \* \* \* \*